(12) United States Patent
Lin et al.

(10) Patent No.: US 11,411,006 B1
(45) Date of Patent: Aug. 9, 2022

(54) MANUFACTURING METHOD OF MEMORY STRUCTURE

(71) Applicant: NANYA TECHNOLOGY CORPORATION, New Taipei (TW)

(72) Inventors: Yu-Ting Lin, New Taipei (TW); Pei-Jhen Wu, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/232,953

(22) Filed: Apr. 16, 2021

(51) Int. Cl.
*H01L 27/108* (2006.01)

(52) U.S. Cl.
CPC .. *H01L 27/10855* (2013.01); *H01L 27/10814* (2013.01)

(58) Field of Classification Search
None
See application file for complete search history.

(56) References Cited

U.S. PATENT DOCUMENTS

| | | | | |
|---|---|---|---|---|
| 9,054,113 B1* | 6/2015 | Zhou | | H01L 23/544 |
| 9,881,924 B2* | 1/2018 | Wang | | H01L 21/31053 |
| 10,593,678 B1* | 3/2020 | Guo | | H01L 27/10888 |
| 2014/0117566 A1* | 5/2014 | Choi | | H01L 27/10891 |
| | | | | 257/776 |
| 2016/0203992 A1* | 7/2016 | Yoon | | H01L 27/10876 |
| | | | | 438/702 |
| 2020/0066730 A1* | 2/2020 | Guo | | H01L 27/10885 |

* cited by examiner

*Primary Examiner* — Steven M Christopher
(74) *Attorney, Agent, or Firm* — Muncy, Geissler, Olds & Lowe, PC

(57) ABSTRACT

The present disclosure provides a manufacturing method of a memory structure. The manufacturing method includes the operations of: receiving a substrate; forming a landing pad layer in the substrate; forming trenches over the landing pad layer; and forming a top pad over the trenches to form the capacitor array. The operation of forming the trenches over the landing pad layer includes the operations of: forming an integrated layer having an array pattern over the landing pad layer; forming, by a chop mask, a masking layer to mask an edge portion of the array pattern so as to define a rectangle portion of the array pattern; and etching the integrated layer according to the rectangle portion of the array pattern to form the plurality of trenches. The edge portion of the array pattern surrounds the rectangle portion of the array pattern.

20 Claims, 36 Drawing Sheets

MANUFACTURING METHOD OF MEMORY STRUCTURE

TECHNICAL FIELD

The present disclosure relates to a manufacturing method, and more particularly, to a manufacturing method of a memory structure.

DISCUSSION OF THE BACKGROUND

The semiconductor memory structure includes capacitors to hold electrical states so as to store data or information based on the stored electrical states. With the advancement of semiconductor generation, the dimensions of elements in semiconductor structure shrink rapidly, and the pitch between the capacitors shrinks rapidly as well. The shrunk dimension notoriously causes many manufacturing failures, such as alignment issue. Therefore, the yield decreases, and the manufacturing cost increases along with the shrinking dimension. In order to overcome the issue caused by the shrunk dimension, the accuracy of the manufacturing has to be improved, and the tools used in the manufacturing has to be designed finer. However, improving the accuracy of the manufacturing and fining the tools used in the manufacturing also raise the total cost of the final products.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a manufacturing method of a memory structure. The manufacturing method includes the operations of: receiving a substrate; forming a landing pad layer in the substrate; forming a plurality of trenches over the landing pad layer; and forming a top pad over the plurality of trenches to form the capacitor array. The operation of forming the plurality of trenches over the landing pad layer includes the operations of: forming an integrated layer having an array pattern over the landing pad layer; forming, by a chop mask, a masking layer to mask an edge portion of the array pattern so as to define a rectangle portion of the array pattern; and etching the integrated layer according to the rectangle portion of the array pattern to form the plurality of trenches. The edge portion of the array pattern surrounds the rectangle portion of the array pattern.

In some embodiments, the array pattern includes a plurality of first strips and a plurality of second strips. The operation of forming the integrated layer having the array pattern over the landing pad layer includes the operations of: forming the plurality of first strips parallel extending along a first direction; and forming the plurality of second strips parallel extending along a second direction over the plurality of first strips, wherein the second direction is different from the first direction. A plurality of gaps are arranged between the plurality of first strips and the plurality of second strips from a top view of the substrate.

In some embodiments, the operation of forming the plurality of first strips parallel extending along the first direction includes the operations of: depositing a first carbon layer; depositing a first dielectric layer on the first carbon layer; depositing a second carbon layer on the first dielectric layer; depositing a second dielectric layer on the second carbon layer; and performing a first pitch doubling process to form the plurality of first strips.

In some embodiments, the operation of forming the plurality of second strips parallel extending along the second direction over the plurality of first strips includes the operations of: spin coating a first photoresistor layer over the plurality of first strips; depositing a third dielectric layer over the first photoresistor layer; and performing a second pitch doubling process to form the second strips.

In some embodiments, the plurality of first strips are formed in the first dielectric layer, and the plurality of second strips are formed in the hard mask layer.

In some embodiments, the operation of etching the integrated layer according to the rectangle portion of the array pattern to form the plurality of trenches includes the operation of: etching the plurality of gaps within the rectangle portion of the array pattern.

In some embodiments, the operation of etching the integrated layer according to the rectangle portion of the array pattern to form the plurality of trenches further includes the operation of: etching a plurality of layers beneath the first carbon layer according to the rectangle portion of the array pattern to form the plurality of trenches.

In some embodiments, the plurality of layers includes a first oxide layer, a second oxide layer, a first nitride layer, a third oxide layer, a second nitride layer, a conductive layer, and a fourth oxide layer. The first oxide layer is disposed over the landing pad layer. The second oxide layer is disposed over the first oxide layer. The first nitride layer is disposed over the second oxide layer. The third oxide layer is disposed over the first nitride layer. The second nitride layer is disposed over the third oxide layer. The conductive layer is disposed over the second nitride layer. The fourth oxide layer is disposed over the conductive layer and beneath the first carbon layer.

In some embodiments, the operation of etching the plurality of layers according to the rectangle portion of the array pattern to form the plurality of trenches further includes the operation of: after etching the integrated dielectric layer, removing the conductive layer.

In some embodiments, each of the plurality of gaps has a diamond shape from the top view of the substrate.

In some embodiments, each of the plurality of gaps has a first diagonal about 30 nm.

In some embodiments, each of the plurality of gaps has a second diagonal about 50 nm.

In some embodiments, each of the plurality of trenches has a round shape from the top view of the substrate.

In some embodiments, the plurality of gaps in an edge of the rectangle portion of the array pattern are aligned along a line from the top view of the substrate.

In some embodiments, the manufacturing method further includes the operation of: filling a filling material into the plurality of trenches.

In some embodiments, the chop mask has a rectangle pattern corresponding to the rectangle portion of the array pattern, wherein the rectangle pattern has a rectangle contour.

In some embodiments, a first overlay margin between a first boundary of the rectangle portion of the array pattern and a nearest gap of the plurality of gaps within the rectangle portion of the array pattern is less than 15 nm.

In some embodiments, a second overlay margin between a second boundary of the rectangle portion of the array pattern and a nearest gap of the plurality of gaps within the rectangle portion of the array pattern is less than 15 nm.

In some embodiments, the first boundary is perpendicular to the second boundary.

In some embodiments, the first overlay margin is less than 10 nm, and the second overlay margin is less than 13 nm.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

Figure 1:
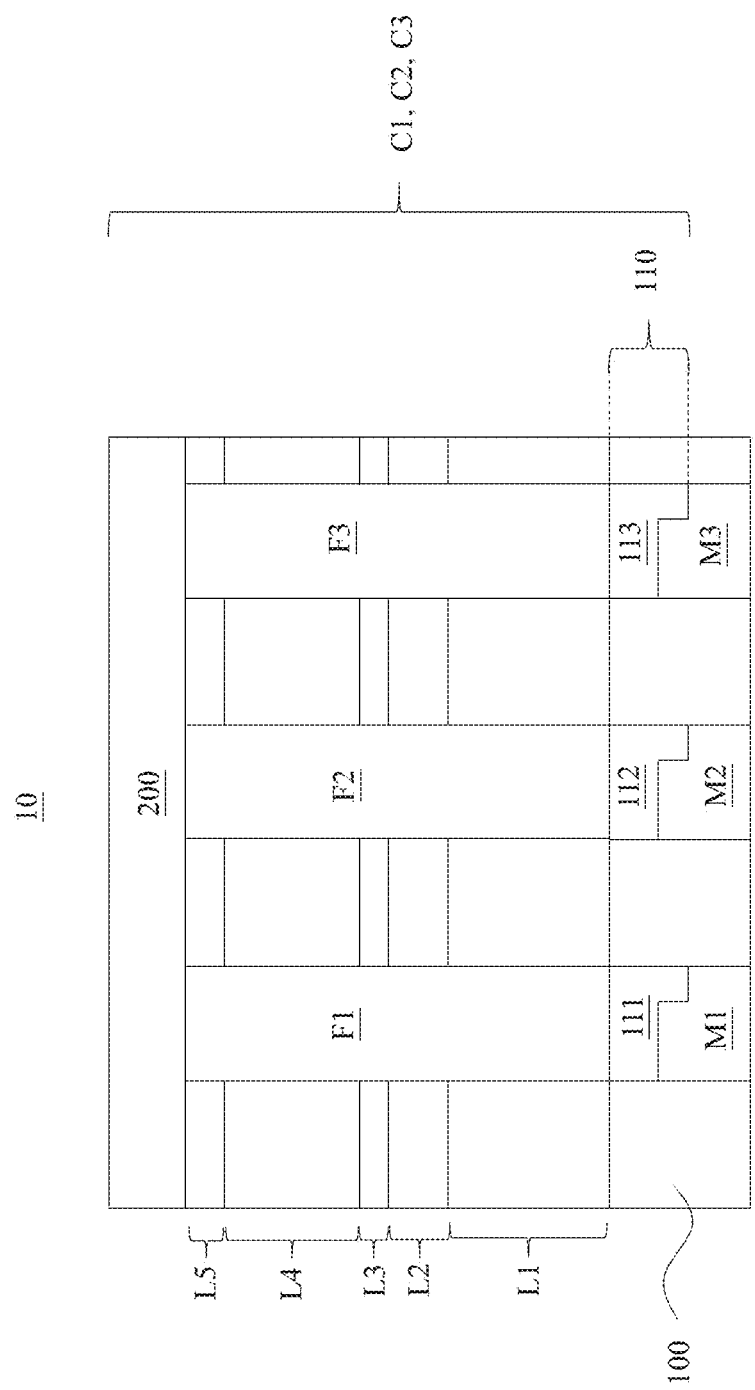
FIG. 1 is schematic diagram of a memory structure according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic diagram of a memory structure 10 according to some embodiments of the present disclosure. In some embodiments, the memory structure includes a substrate 100, capacitors C1-C3, and transistors M1-M3. The transistors M1-M3 are arranged in the substrate 100. The capacitors C1-C3 are coupled to the transistor M1-M3, respectively. As illustrated in FIG. 1, the capacitors C1-C3 includes landing pads 111-113, a top pad 200 and filling materials F1-F3, respectively. Therefore, the landing pads 111-113, the filling materials F1-F3, the top pad 200 are respectively formed a metal-insulator-metal capacitor structure. The landing pads 111-113 are disposed in a landing pad layer 110 in the substrate 100. In some embodiments, the landing pads 111-113 are coupled to gates of transistors M1-M3, respectively.

In some embodiments, the landing pad layer 110 includes tungsten (W). In some embodiments, the landing pad 111-113 are made by W.

The memory structure 10 further includes a plurality of layers L1-L5 disposed between the landing pad layer 110 and the top pad 200. In some embodiments, the plurality of layers L1-L5 are configured to separate the capacitors C1-C3. The layer L1 includes oxide. The layer L2 includes oxide. The layer L3 includes nitride. The layer L4 includes oxide. The layer L5 includes nitride.

The capacitors C1-C3 are respectively configured to maintain an electrical state, i.e., charged state or uncharged stated, so as to represent a stored data based on the electric state.

There are three capacitors C1-C3 shown in the memory structure 10, however, the present disclosure is not limited thereto. It is noted that the memory structure 10 may include more than three capacitors C1-C3. For example, the memory structure 10 includes a capacitor array CA as shown in FIG. 2.

Figure 2:
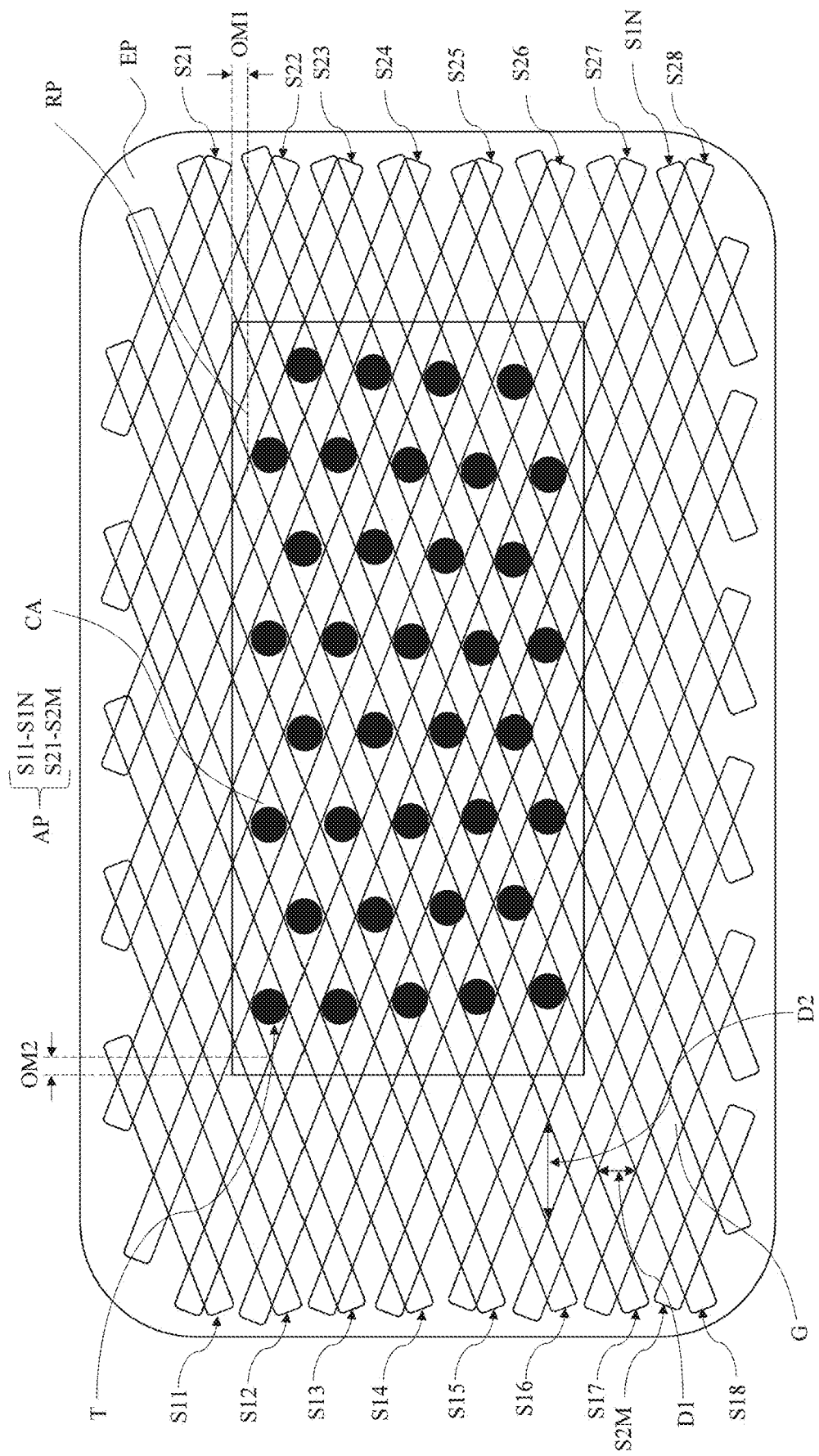
FIG. 2 is a schematic diagram of a capacitor array from a top view of the substrate according to some embodiments of the present disclosure.
Figure 3:
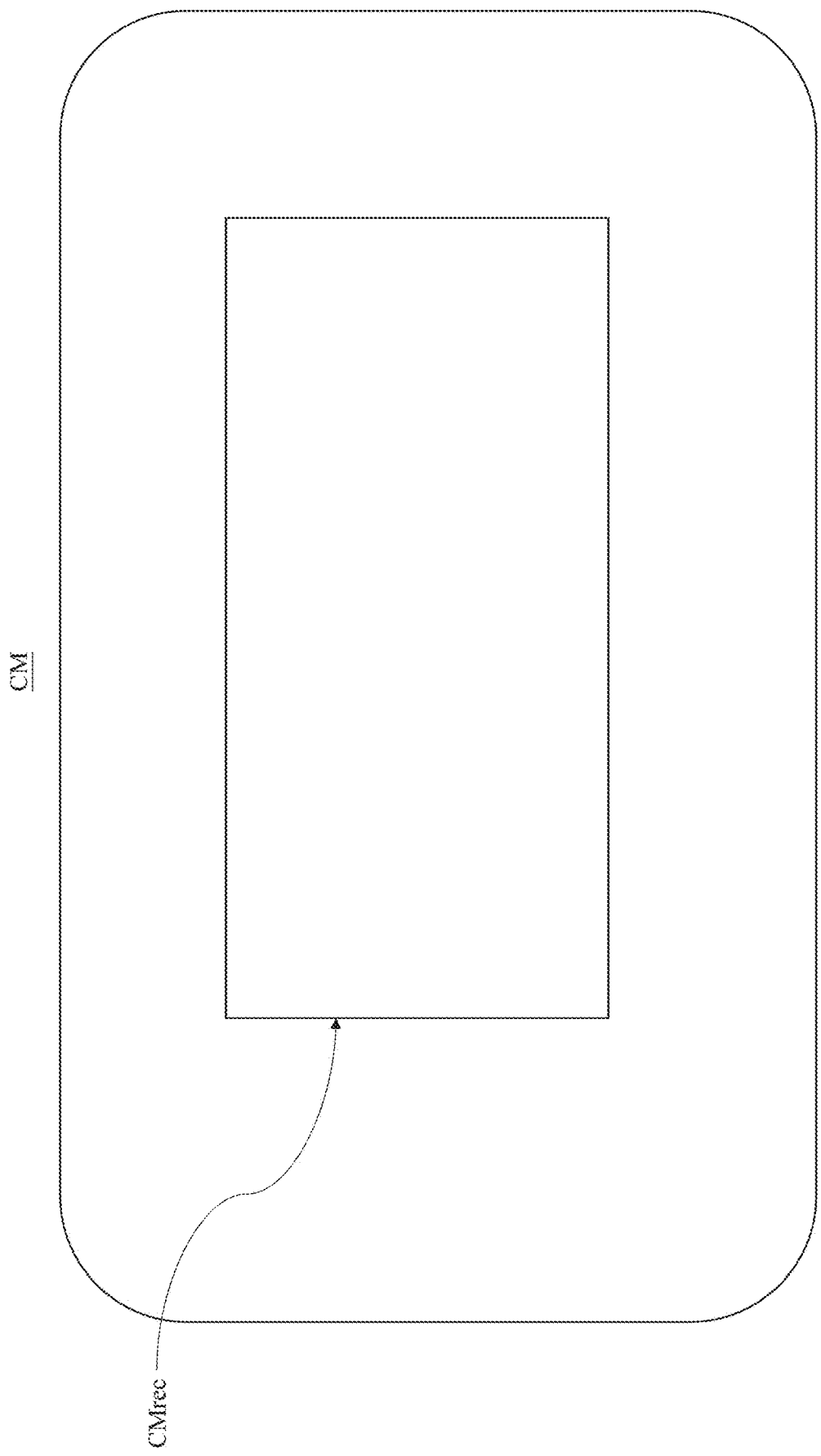
FIG. 3 is a schematic diagram of a chop mask according to some embodiments of the present disclosure.

Reference is made to FIG. 2 and FIG. 3. FIG. 2 is a schematic diagram of a capacitor array CA from a top view of the substrate 100 according to some embodiments of the present disclosure. FIG. 3 is a schematic diagram of a chop mask CM according to some embodiments of the present disclosure.

In FIG. 2, the top pad 200 and the landing pads 111-113 are omitted from the capacitor array CA to facilitate understanding. The capacitor array CA is defined by an array pattern AP and a masking layer ML (shown in FIG. 27) associated with the chop mask CM.

As illustrated in FIG. 2, the array pattern AP includes a plurality of first strips S11-S1N and a plurality of second strips S21-S2M. The first strips S11-S1N are parallel arranged and extending along a first direction, and the second strips S21-S2M are parallel arranged and extending along a second direction. The first direction is different for the second direction. As the arrangement of the first strips S11-S1N and the second strips S21-S2M, there are a plurality of gaps G array-like arranged between the first strips S11-S1N and the second strips S21-S2M. Each of the gaps G has a diamond shape from the top view of the substrate 100. In some embodiments, the diamond shape has a first diagonal D1 about 30 nm and a second diagonal D2 about 50 nm.

The chop mask CM shown in FIG. 3 is configured to pattern the masking layer ML to define an edge portion EP of the array pattern AP and a rectangle portion RP of the array pattern AP. The edge portion EP surrounds the rectangle portion RP. As illustrated in FIG. 3, the chop mask CM includes a rectangle pattern CMrec, i.e., the rectangle pattern CMrec has a rectangle contour. The rectangle pattern CMrec corresponds to the rectangle portion RP of the array pattern AP as shown in FIG. 2.

After the array pattern AP is defined as the edge portion EP and the rectangle portion RP, the gaps G within the rectangle portion RP are etched to from a plurality of trenches T. The trenches T are configured to be filled with the filling materials F1-F3 to become a part of the capacitors C1-C3 shown in FIG. 1.

Because the gaps G are array-like arranged, the trenches T are array-like arranged as well. In other words, the trenches T is a trench array. Therefore, after the trenches T are filled with the filling materials F1-F3, the filled trench array becomes the capacitor array CA as shown in FIG. 2. In some embodiments, each trench T has a substantially round shape; that is the trenches T do not occupy all of the space in the gaps G.

As defining by the rectangle pattern CMrec of the chop mask CM, the gaps G in the edge of the rectangle portion RP of the array pattern AP are aligned along a line from a top view of the substrate 100. In FIG. 2, there are 4 gaps G on the left edge of the rectangle portion RP are aligned along a vertical line, and there are 4 gaps G on the top edge of the rectangle portion RP are aligned along a horizontal line.

In some embodiments, a first overlay margin OM1 between a top boundary of the rectangle portion RP of the array pattern AP and a nearest gap G of the plurality of gaps G within the rectangle portion RP of the array pattern AP is less than about 15 nm, and a second overlay margin OM2 between a left boundary of the rectangle portion RP of the array pattern AP and a nearest gap G of the plurality of gaps G within the rectangle portion RP of the array pattern AP is less than about 15 nm.

It is noted that the arrangement of the gaps G within the rectangle pattern RP of the array pattern AP are lateral symmetry. Therefore, the first overlay margin OM1 can also represent the distance between a bottom boundary of the rectangle portion RP of the array pattern AP and a nearest gap G of the plurality of gaps G within the rectangle portion RP of the array pattern AP, and the second overlay margin OM2 can also represent the distance between a right boundary of the rectangle portion RP of the array pattern AP and a nearest gap G of the plurality of gaps G within the rectangle portion RP of the array pattern AP.

In other embodiments, the first overlay margin OM1 is less than about 10 nm, and the second overlay margin OM2 is less than about 13 nm.

Reference is made to FIG. 4 to FIG. 30. FIG. 4 to FIG. 30 are schematic cross section views of the memory structure 10 during the manufacturing process according to some embodiments of present disclosure.

Figure 4:
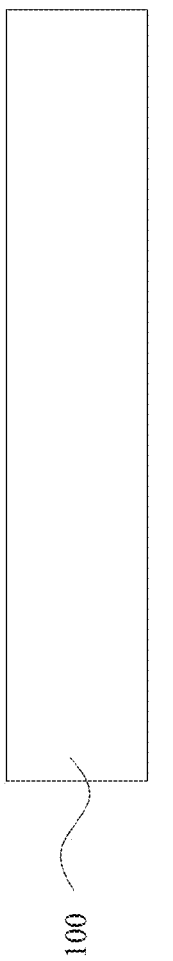
FIG. 4 is a schematic cross section view of the memory structure during the manufacturing process according to some embodiments of present disclosure.

In FIG. 4, the substrate 100 is provided. In some embodiments, the substrate 100 is a semiconductor substrate, such as a silicon substrate or a substrate made by other suitable materials.

Figure 5:
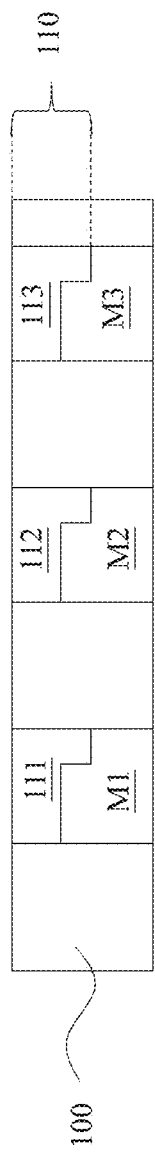
FIG. 5 is a schematic cross section view of the memory structure during the manufacturing process according to some embodiments of present disclosure.

In FIG. 5, the transistors M1-M3 are formed in the substrate 100, and the landing pad layer 110 is formed over the transistors M1-M3. In some embodiments, the landing pads 111-113 of the landing layer 110 have a trapezoid shape and are coupled to the gates of the transistors M1-M3, respectively. Each of the landing pads 111-113 are electrically isolated from each other.

Figure 6:
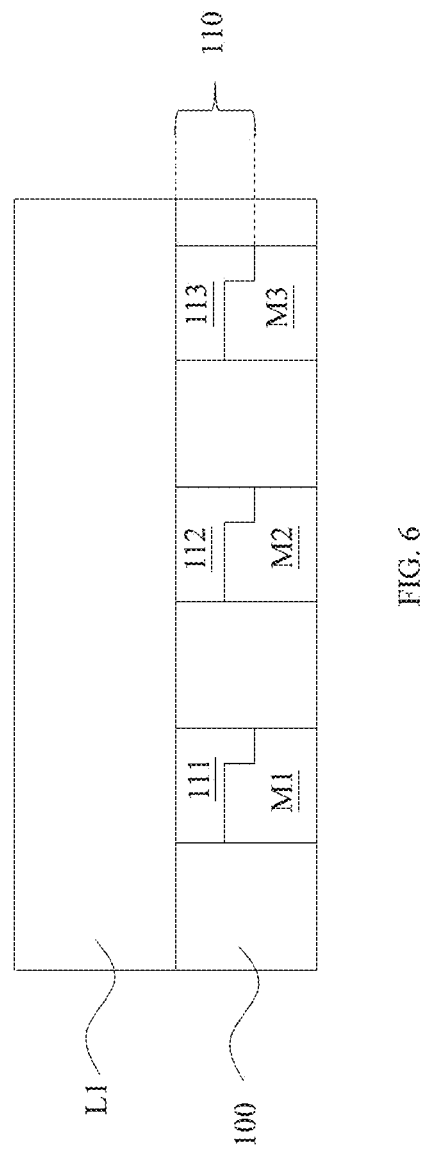
FIG. 6 is a schematic cross section view of the memory structure during the manufacturing process according to some embodiments of present disclosure.

In FIG. 6, an oxide layer L1 is deposited over the substrate 100. The oxide L1 is in contact with a top surface of each of the landing pads 111-113.

Figure 7:
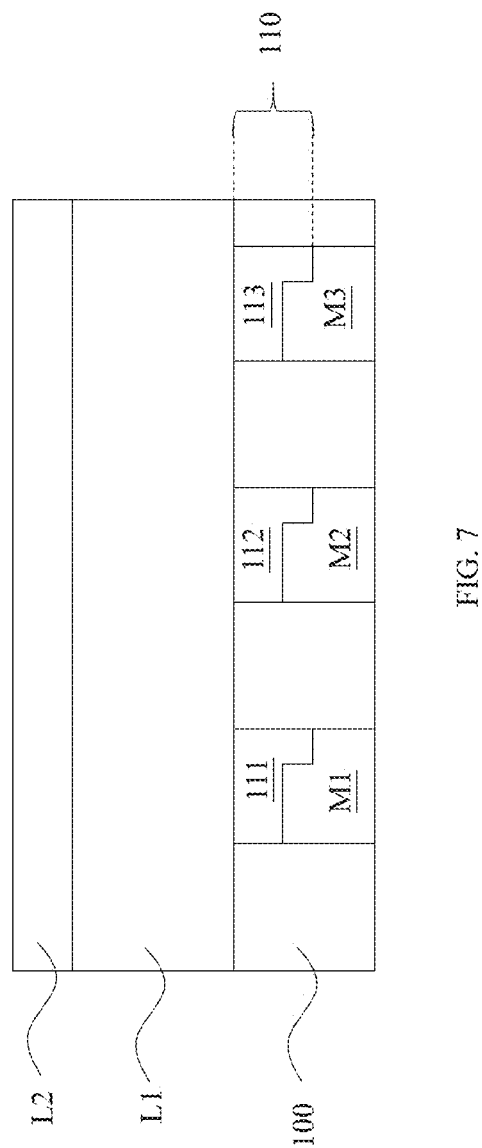
FIG. 7 is a schematic cross section view of the memory structure during the manufacturing process according to some embodiments of present disclosure.

In FIG. 7, an oxide layer L2 is deposited over the oxide layer L1.

Figure 8:
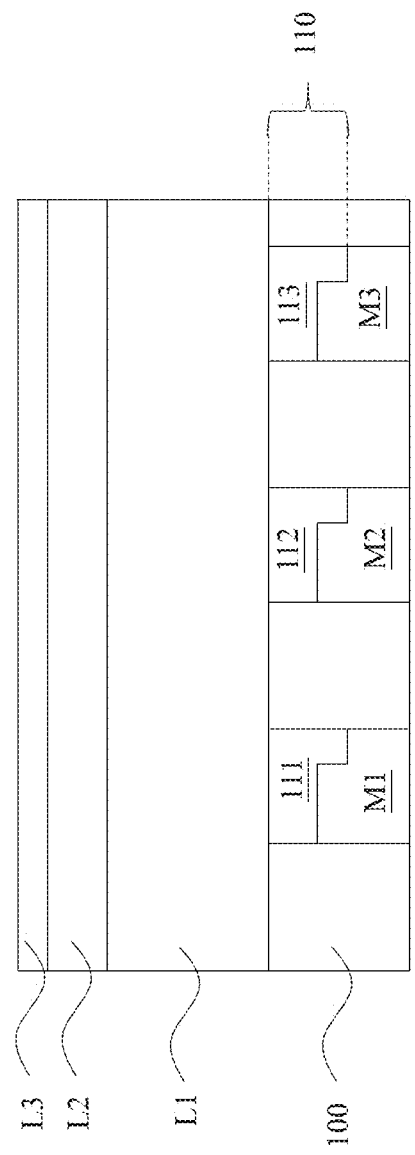
FIG. 8 is a schematic cross section view of the memory structure during the manufacturing process according to some embodiments of present disclosure.

In FIG. 8, a nitride layer L3 is deposited over the oxide layer L2.

Figure 9:
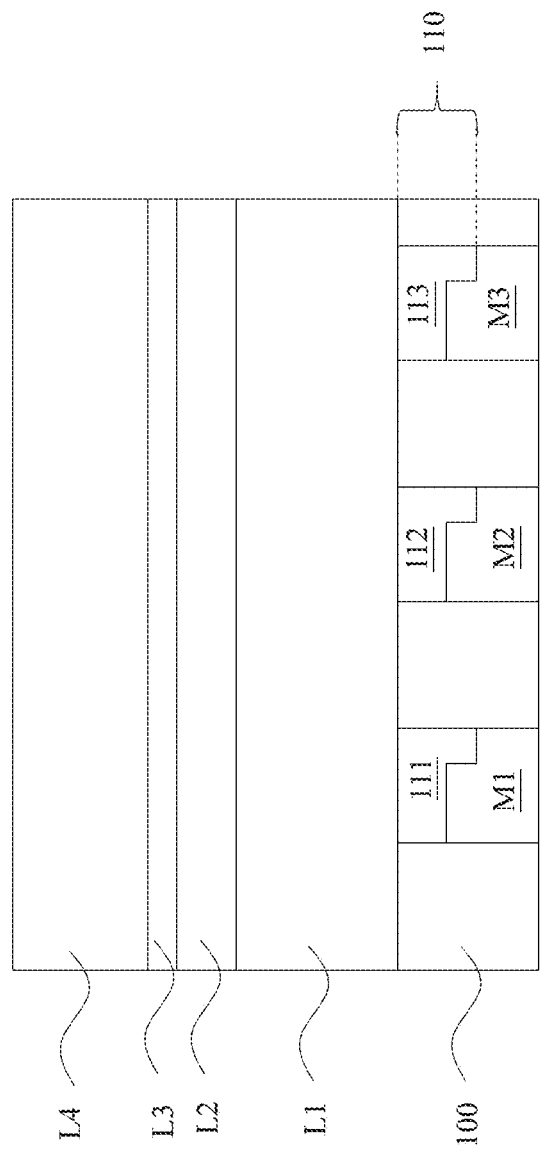
FIG. 9 is a schematic cross section view of the memory structure during the manufacturing process according to some embodiments of present disclosure.

In FIG. 9, an oxide layer L4 is deposited over the nitride layer L3.

Figure 10:
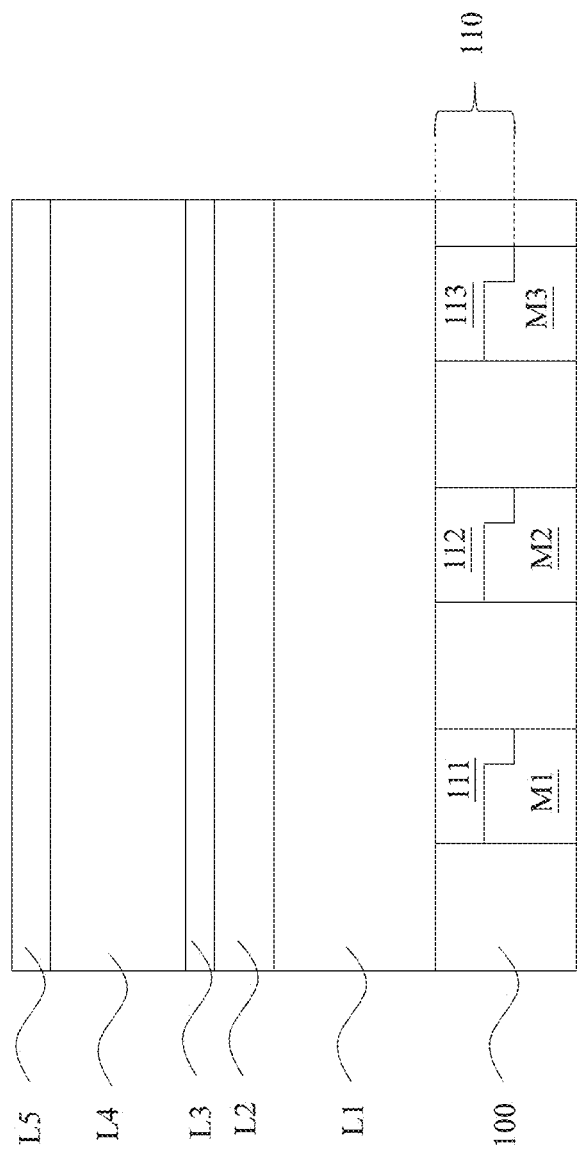
FIG. 10 is a schematic cross section view of the memory structure during the manufacturing process according to some embodiments of present disclosure.

In FIG. 10, a nitride layer L5 is deposited over the oxide layer L4.

Figure 11:
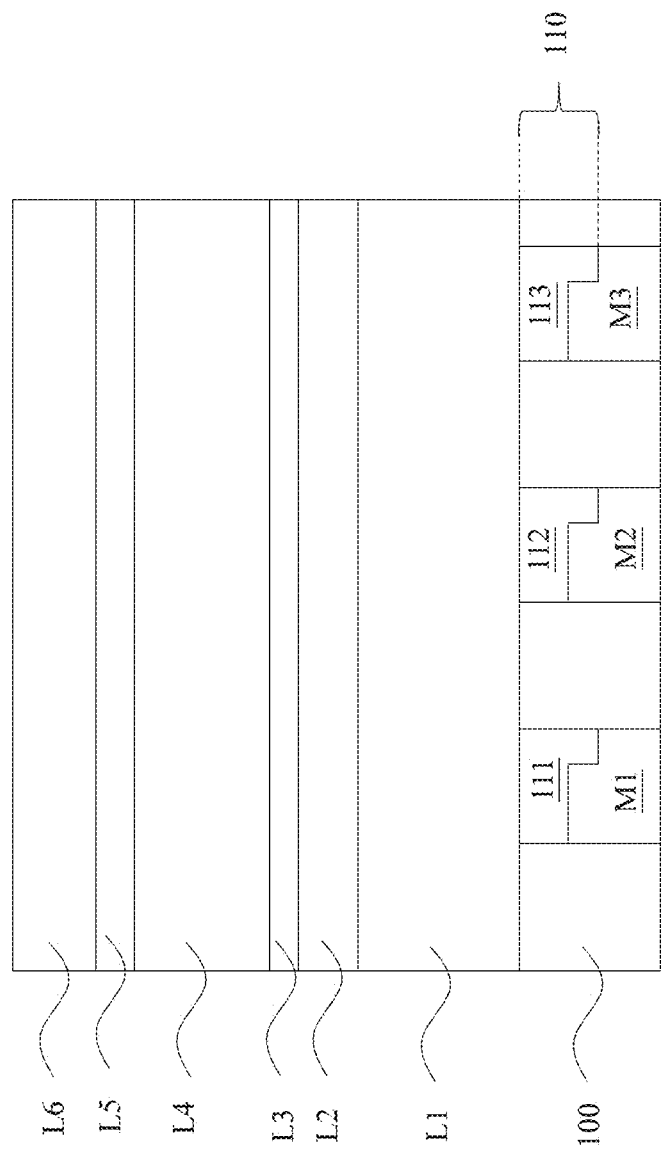
FIG. 11 is a schematic cross section view of the memory structure during the manufacturing process according to some embodiments of present disclosure.

In FIG. 11, a conductive layer L6 is deposited over the nitride layer L5. In some embodiments, the conductive layer L6 includes poly crystal silicon.

Figure 12:
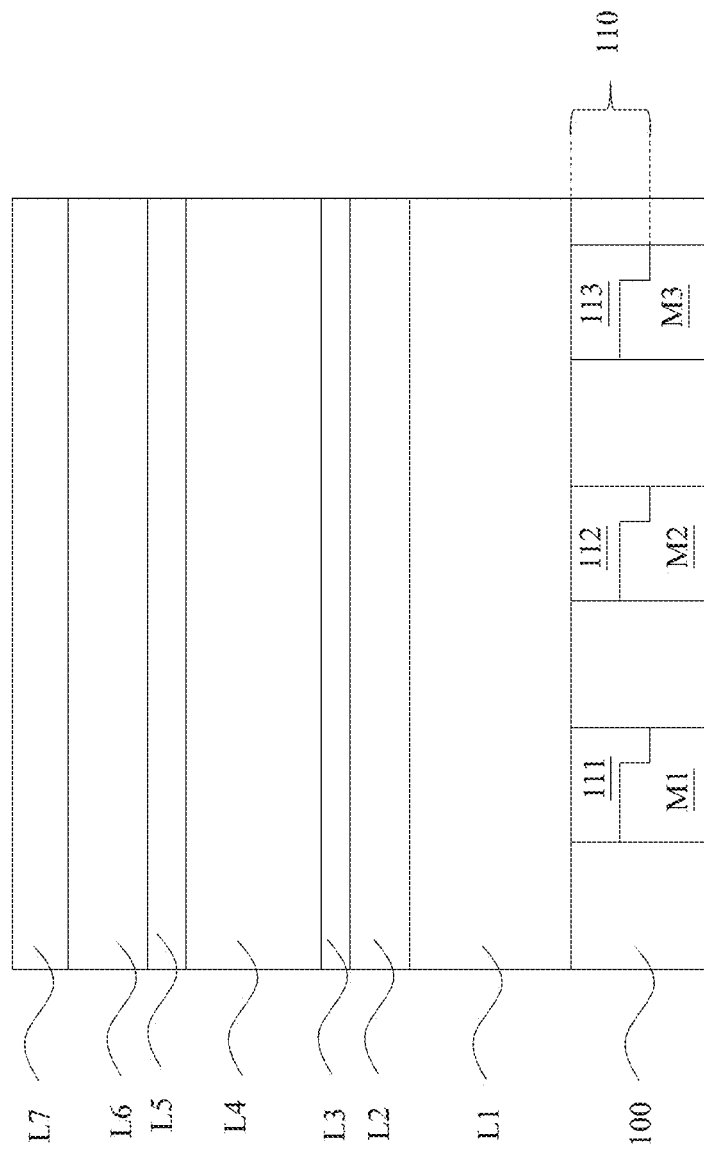
FIG. 12 is a schematic cross section view of the memory structure during the manufacturing process according to some embodiments of present disclosure.

In FIG. 12, an oxide layer L7 is deposited over the conductive layer L6.

In some embodiments, the oxide layer L1, the oxide L2, the nitride layer L3, the oxide layer L4, the nitride layer L5, the conductive layer L6, and the oxide layer L7 have planar top surfaces and planar bottom surfaces as shown in FIG. 6 to FIG. 12.

Figure 13:
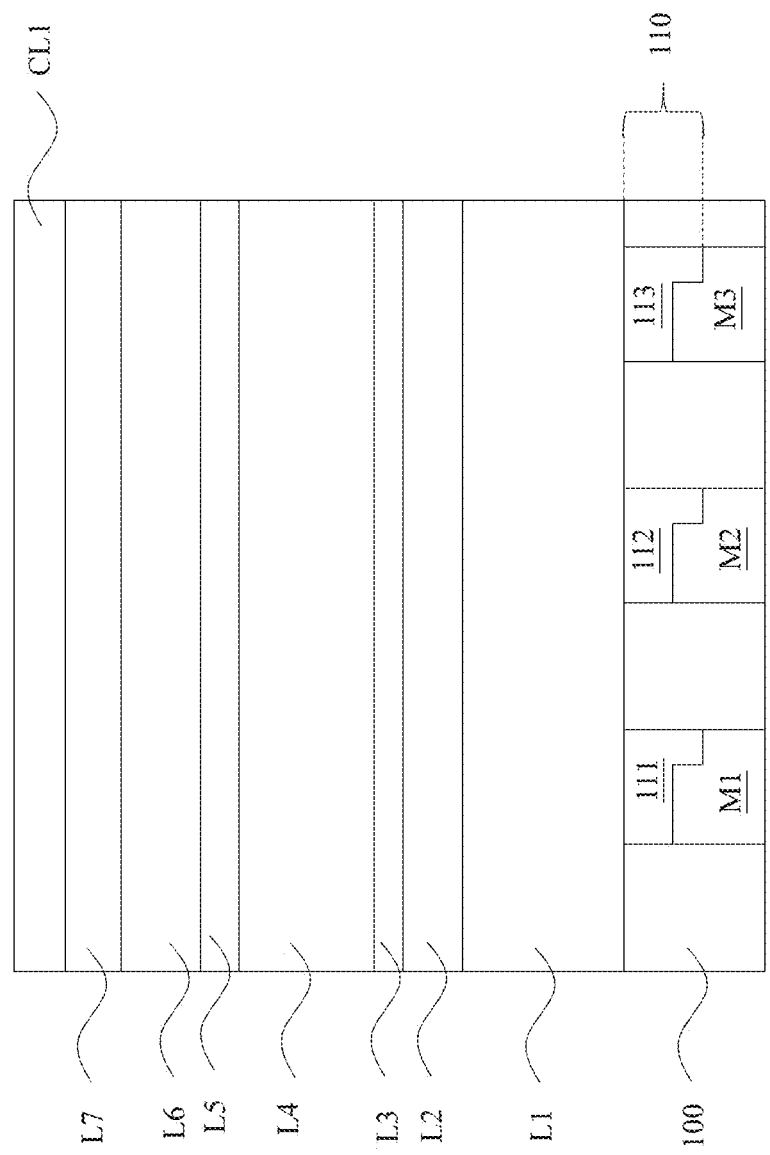
FIG. 13 is a schematic cross section view of the memory structure during the manufacturing process according to some embodiments of present disclosure.

In FIG. 13, a carbon layer CL1 is deposited over the oxide layer L7. In some embodiments, the carbon layer CL1 has a height which is substantially equal to 90 nm.

Figure 14:
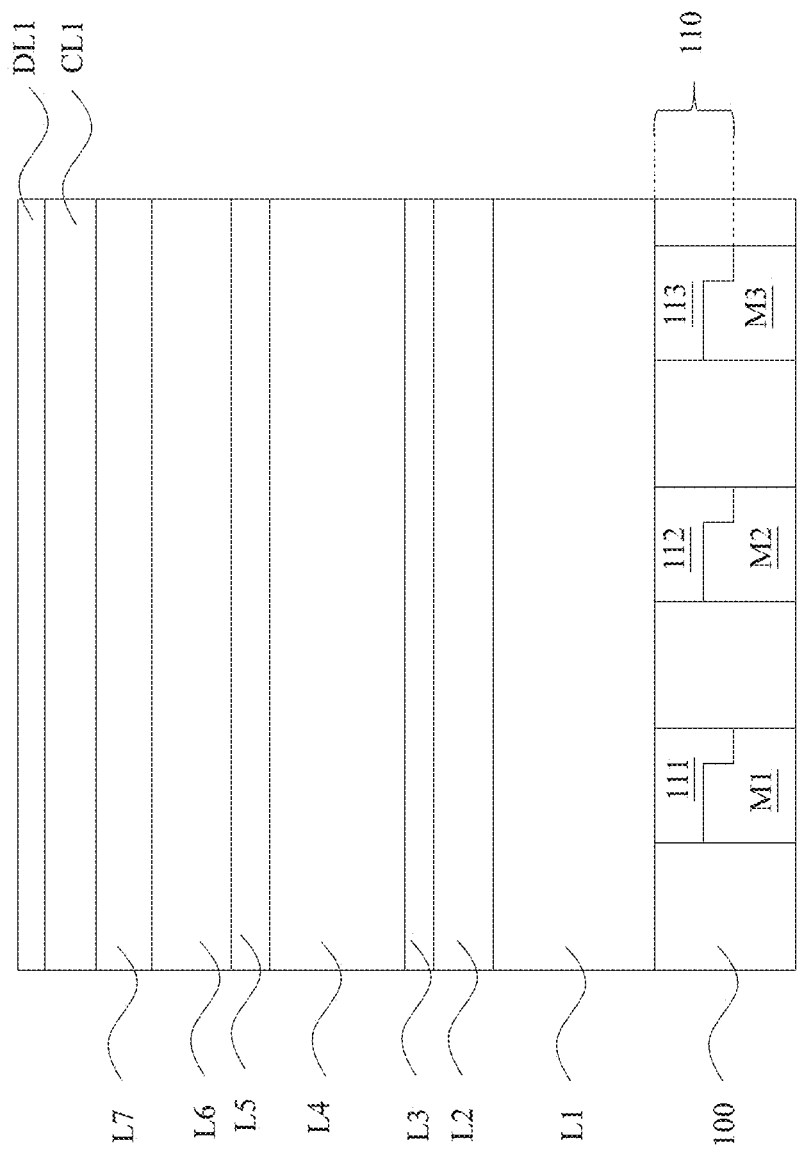
FIG. 14 is a schematic cross section view of the memory structure during the manufacturing process according to some embodiments of present disclosure.

In FIG. 14, a dielectric layer DL1 is deposited over the carbon layer CL1. In some embodiments, the dielectric layer DL1 includes silicon nitride (S1N). In some embodiments, the dielectric layer DL1 is dielectric anti-reflective coating (DARC).

Figure 15:
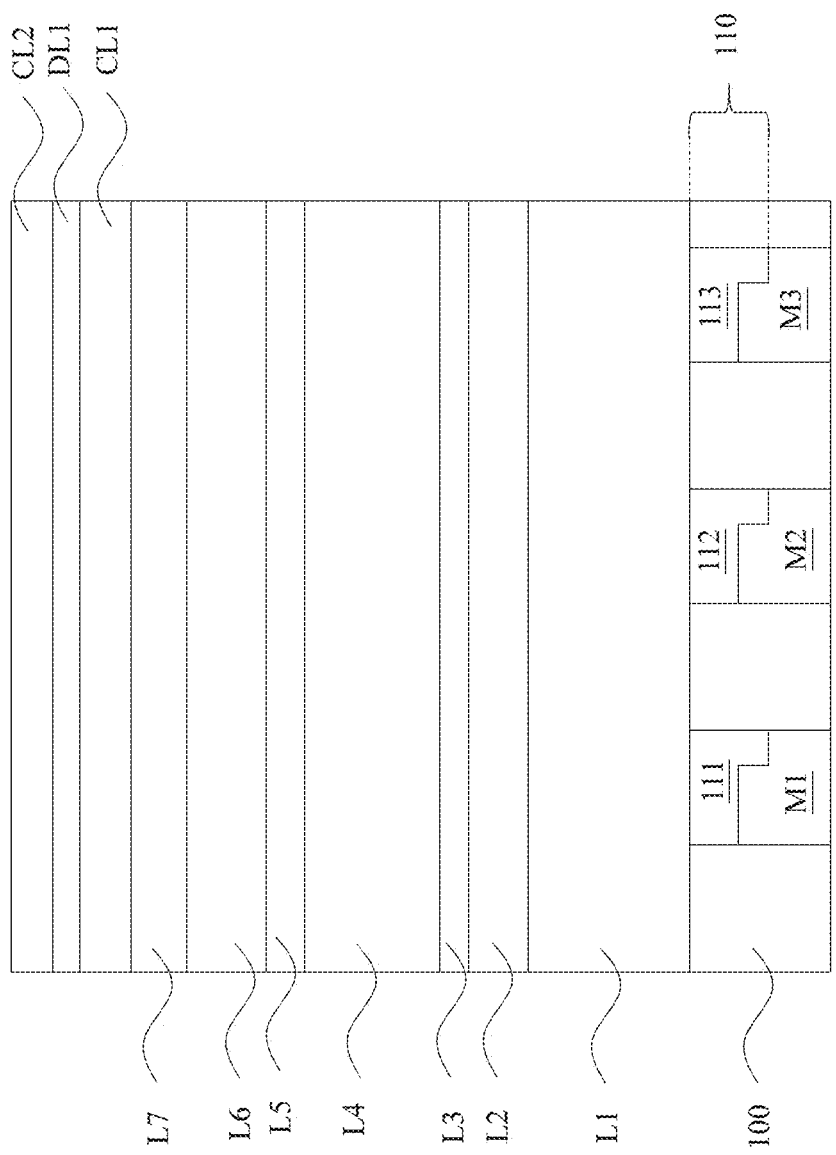
FIG. 15 is a schematic cross section view of the memory structure during the manufacturing process according to some embodiments of present disclosure.

In FIG. 15, a carbon layer CL2 is deposited over the dielectric layer DL1.

Figure 16:
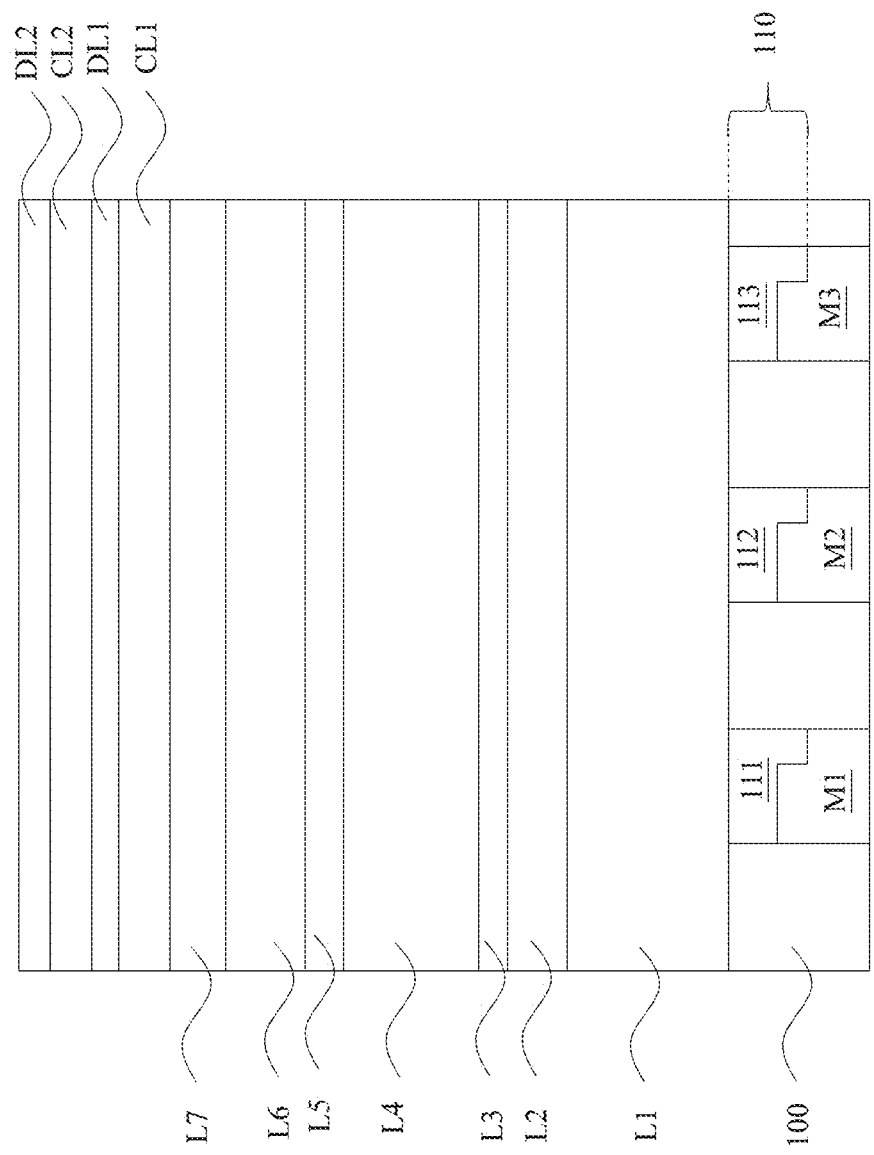
FIG. 16 is a schematic cross section view of the memory structure during the manufacturing process according to some embodiments of present disclosure.

In FIG. 16, a dielectric layer DL2 is deposited over the carbon layer CL2. In some embodiments, the dielectric layer DL2 includes silicon (Si). In other embodiments, the dielectric layer DL2 includes oxygen (O). In some embodiments, the dielectric layer DL2 is dielectric anti-reflective coating.

Figure 17:
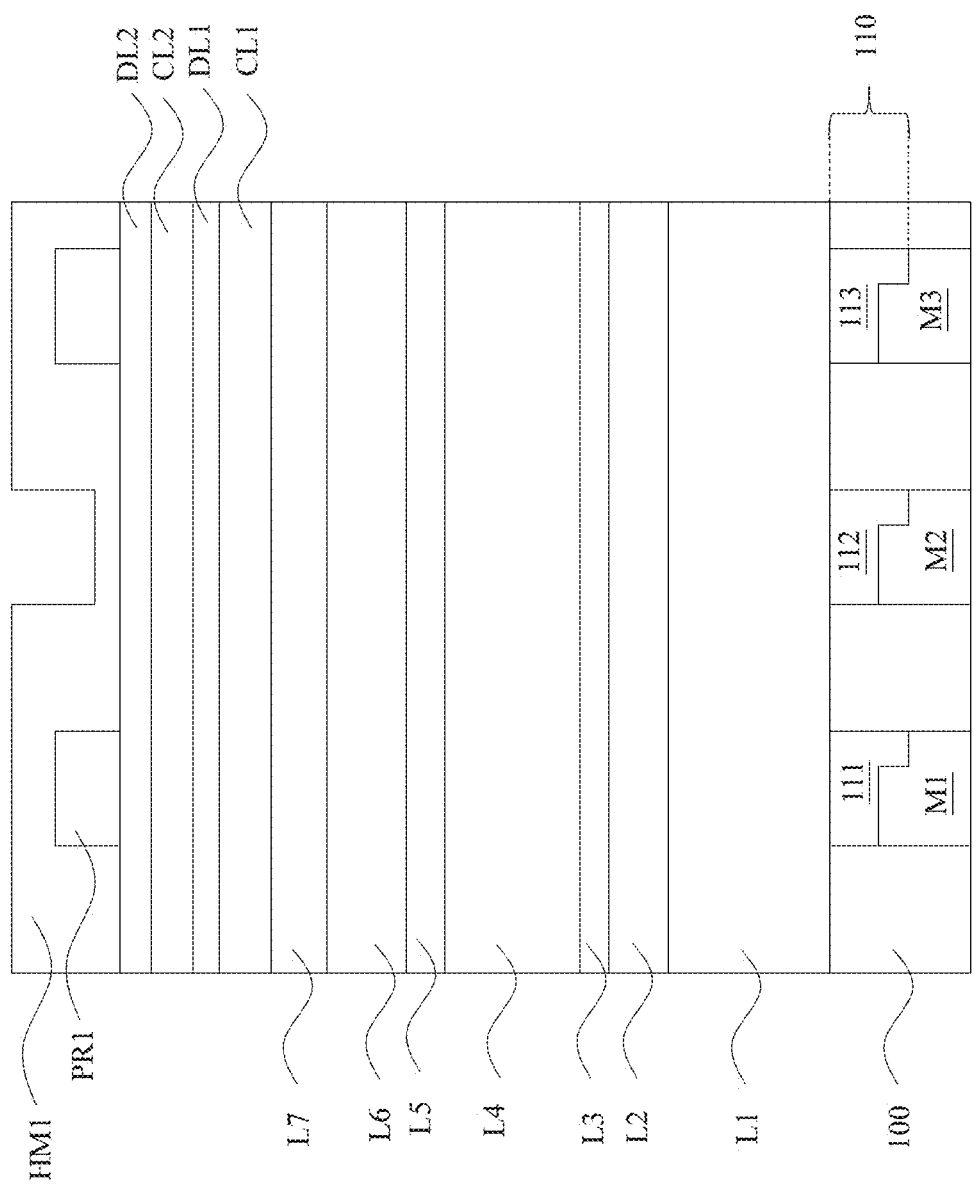
FIG. 17 is a schematic cross section view of the memory structure during the manufacturing process according to some embodiments of present disclosure.

In FIG. 17, a photoresistor layer PR1 is deposited over the dielectric layer DL2. The photoresistor layer PR1 is then patterned. A hard mask layer HM1 is deposited along a contour of the patterned photoresistor layer PR1. Therefore, the hard mask layer HM1 has a similar contour as the photoresistor layer PR1.

Figure 18:
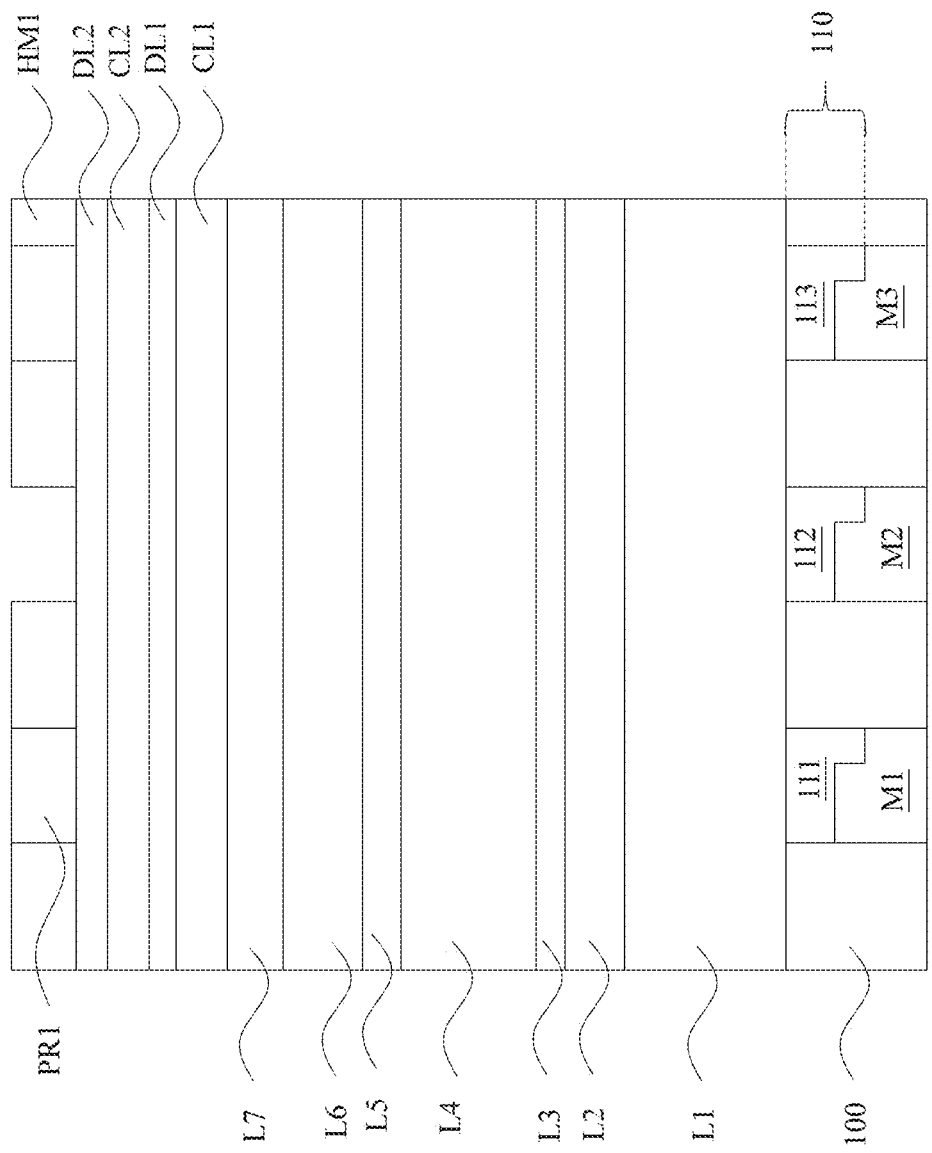
FIG. 18 is a schematic cross section view of the memory structure during the manufacturing process according to some embodiments of present disclosure.

In FIG. 18, the hard mask HM1 is etched. A top surface of the photoresistor PR1 and a portion of the dielectric layer DL2 are exposed. As illustrated in FIG. 18, the remaining portion of the hard mask layer HM1 becomes sidewalls of the remaining portion of the photoresistor layer PR1.

Figure 19:
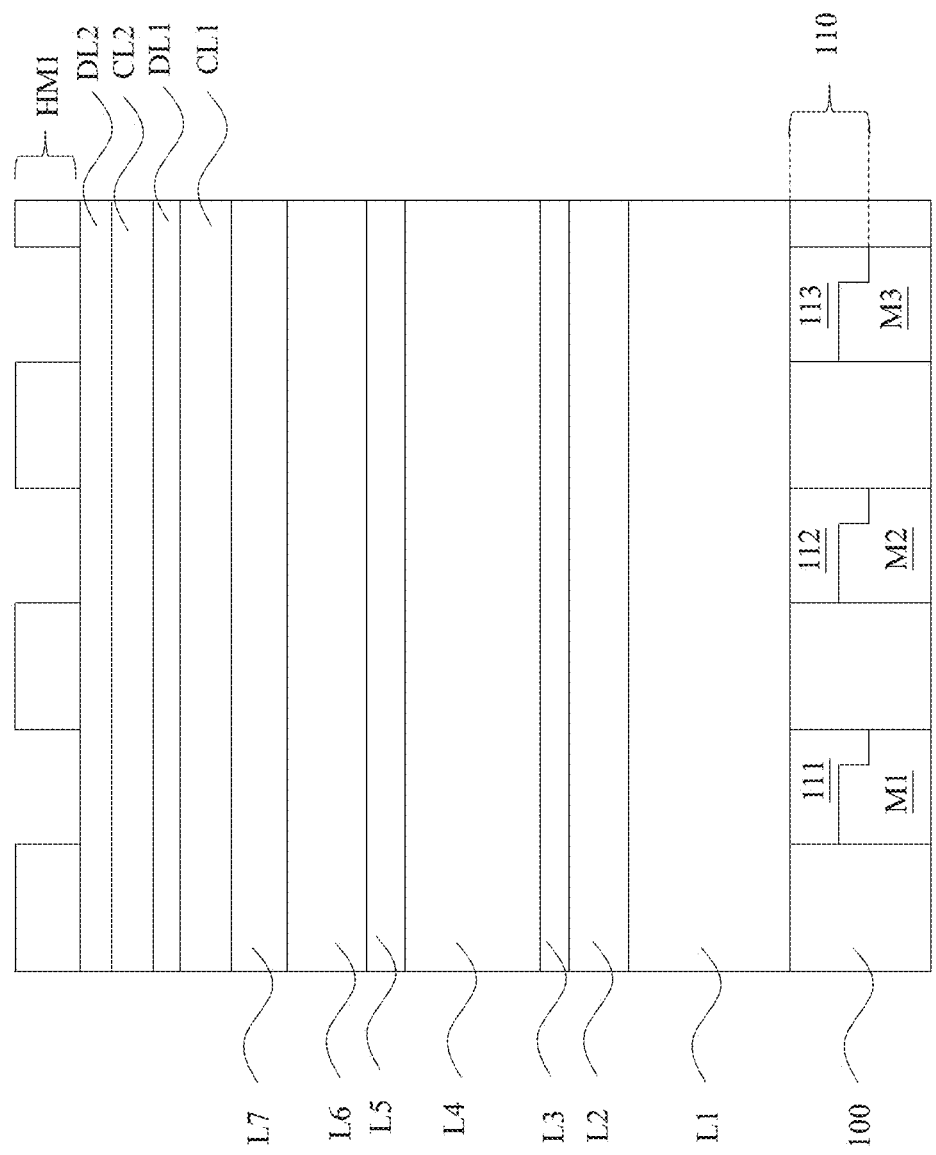
FIG. 19 is a schematic cross section view of the memory structure during the manufacturing process according to some embodiments of present disclosure.

In FIG. 19, the photoresistor layer PR1 is selectively etched, and the hard mask layer HM1 is still remained.

Figure 20:
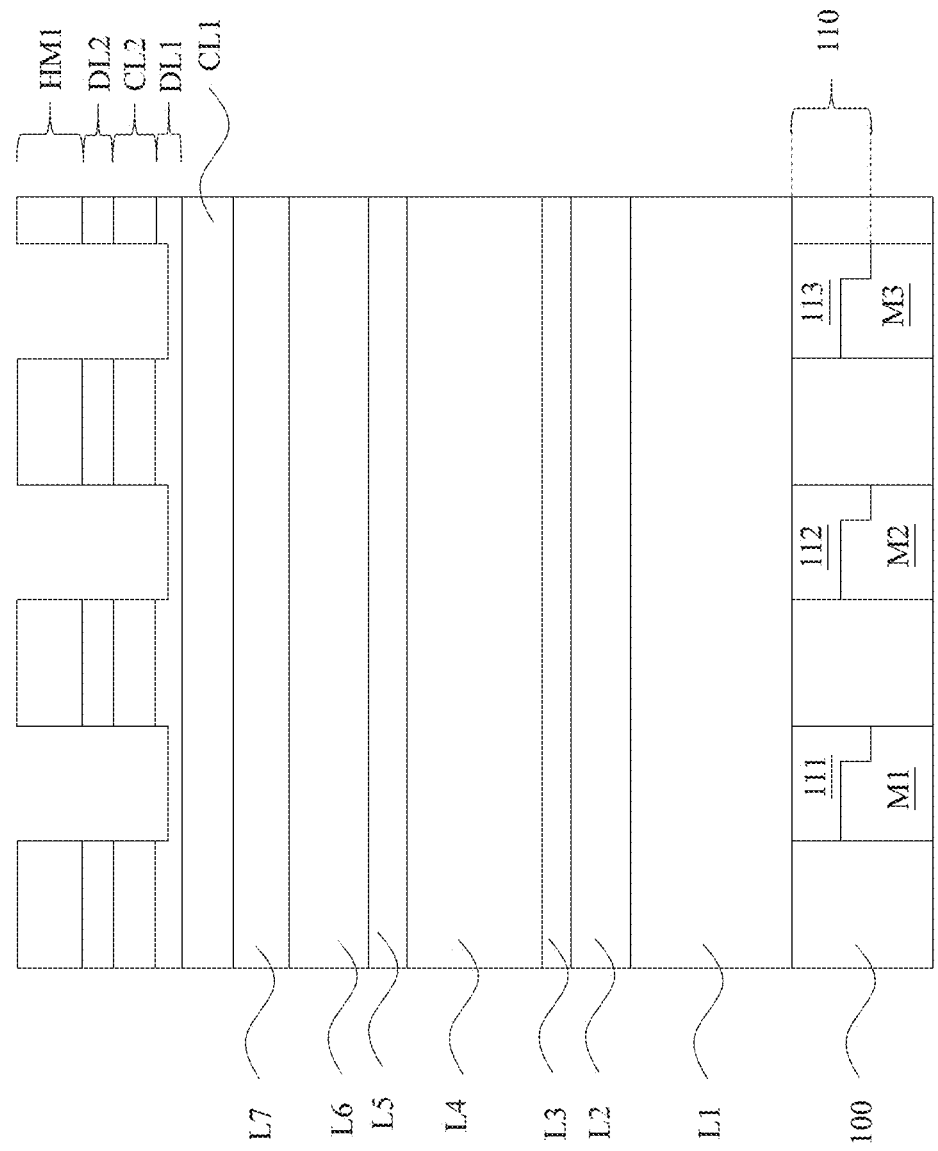
FIG. 20 is a schematic cross section view of the memory structure during the manufacturing process according to some embodiments of present disclosure.

In FIG. 20, the hard mask layer HM1, the dielectric layer DL2, the carbon layer CL2, and a portion of the dielectric layer DL1 are etched according to the remaining hard mask layer HM1. As shown in FIG. 20, the carbon layer CL1 is not exposed.

Figure 21:
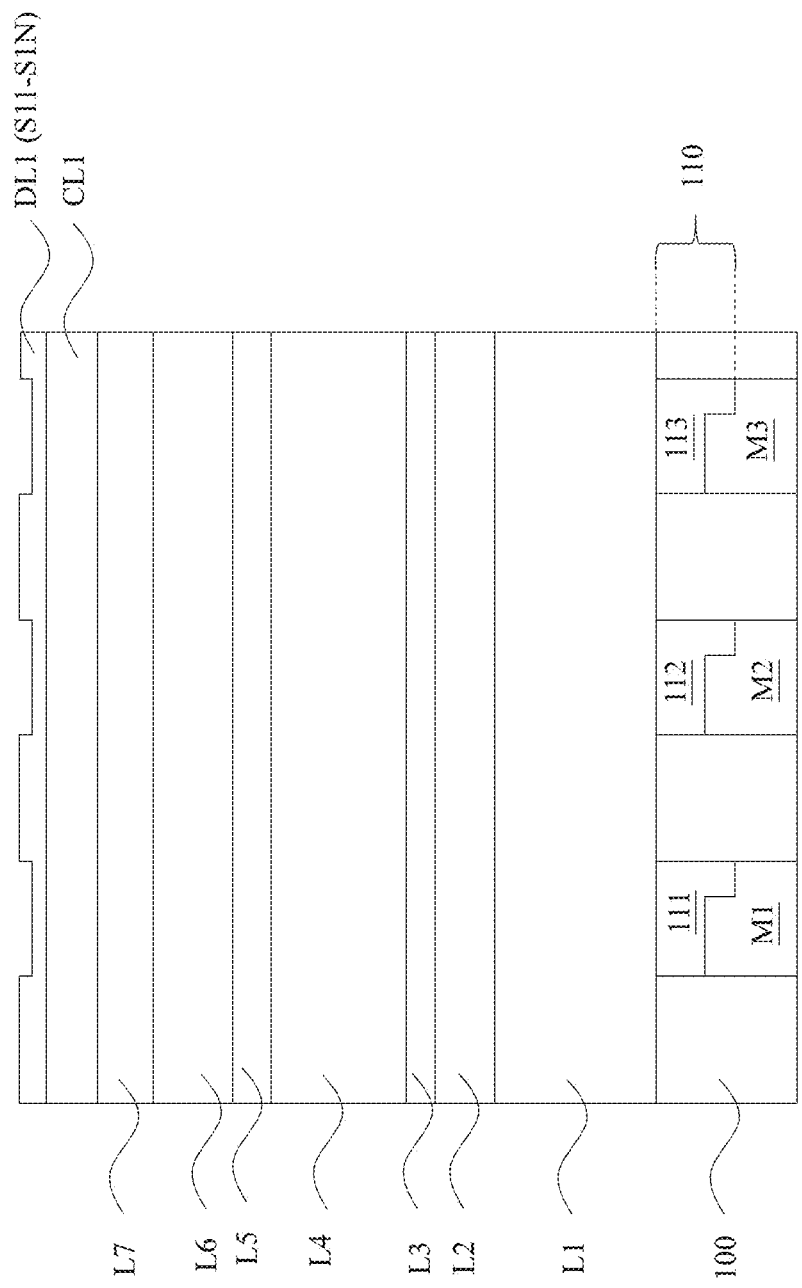
FIG. 21 is a schematic cross section view of the memory structure during the manufacturing process according to some embodiments of present disclosure.

In FIG. 21, the carbon layer CL2, the dielectric layer DL2, and the hard mask layer HM1 are etched. The remaining dielectric layer DL1 shown in FIG. 21 is a part of the array patter AP shown in FIG. 2. More specifically, the remaining dielectric layer DL1 shown in FIG. 21 forms the plurality of first strips S11-S1N shown in FIG. 2. In some embodiments, an ashing etching is performed when the hard mask layer HM1, the dielectric layer DL2, the carbon layer CL2, and a portion of the dielectric layer DL1 are etched.

In some embodiments, the manufacturing process shown in FIG. 17 to FIG. 21 is a pitch doubling process. Compared the pitch in the photoresistor layer PR1 shown in FIG. 17 to the pitch in the dielectric layer DL1 shown in FIG. 21, the pitch in the dielectric layer DL1 shown in FIG. 21 is about half of the pitch in the photoresistor layer PR1 shown in FIG. 17.

Figure 22:
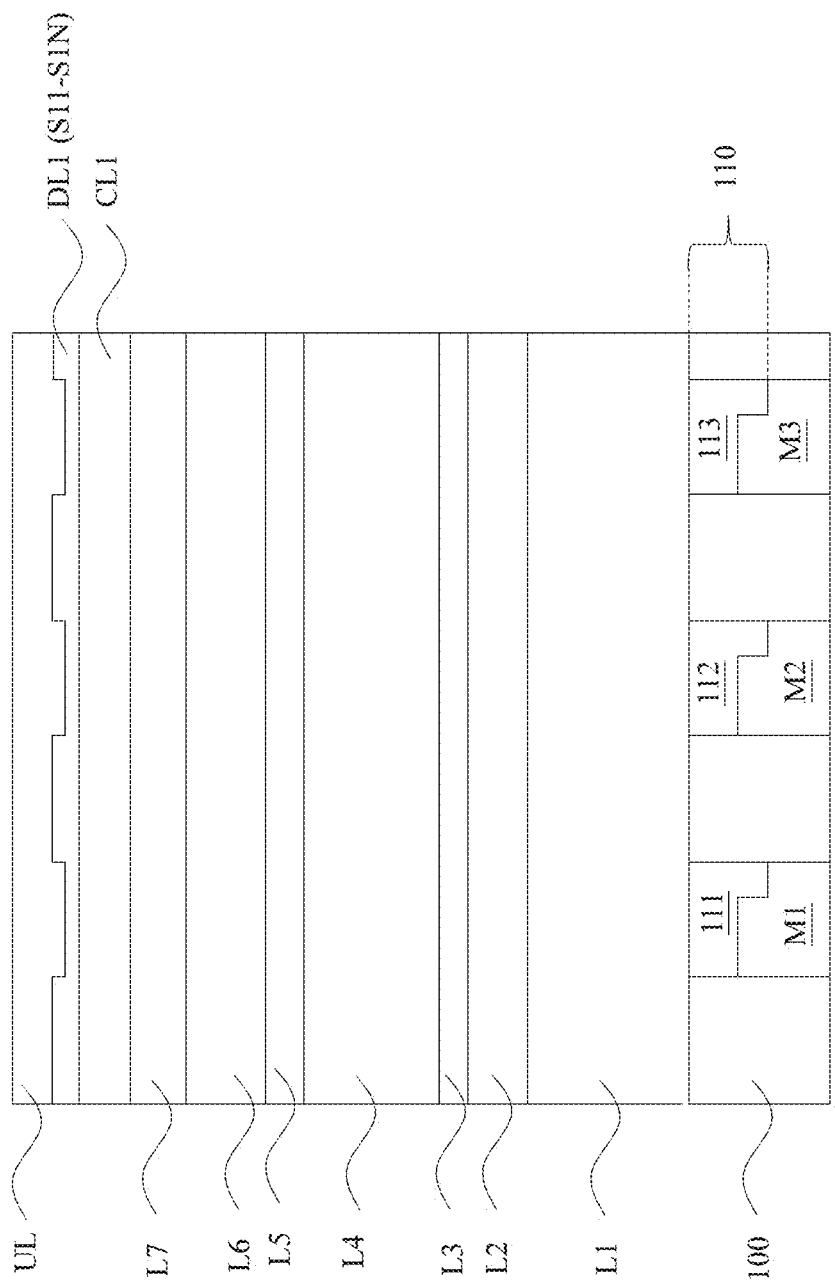
FIG. 22 is a schematic cross section view of the memory structure during the manufacturing process according to some embodiments of present disclosure.

In FIG. 22, an under layer UL is deposited over the dielectric layer DL1. The under layer UL has a planar top surface. In some embodiments, the under layer UL is a photoresistor layer. In some embodiments, the under layer UL is spin coated on the dielectric layer DL1.

Figure 23:
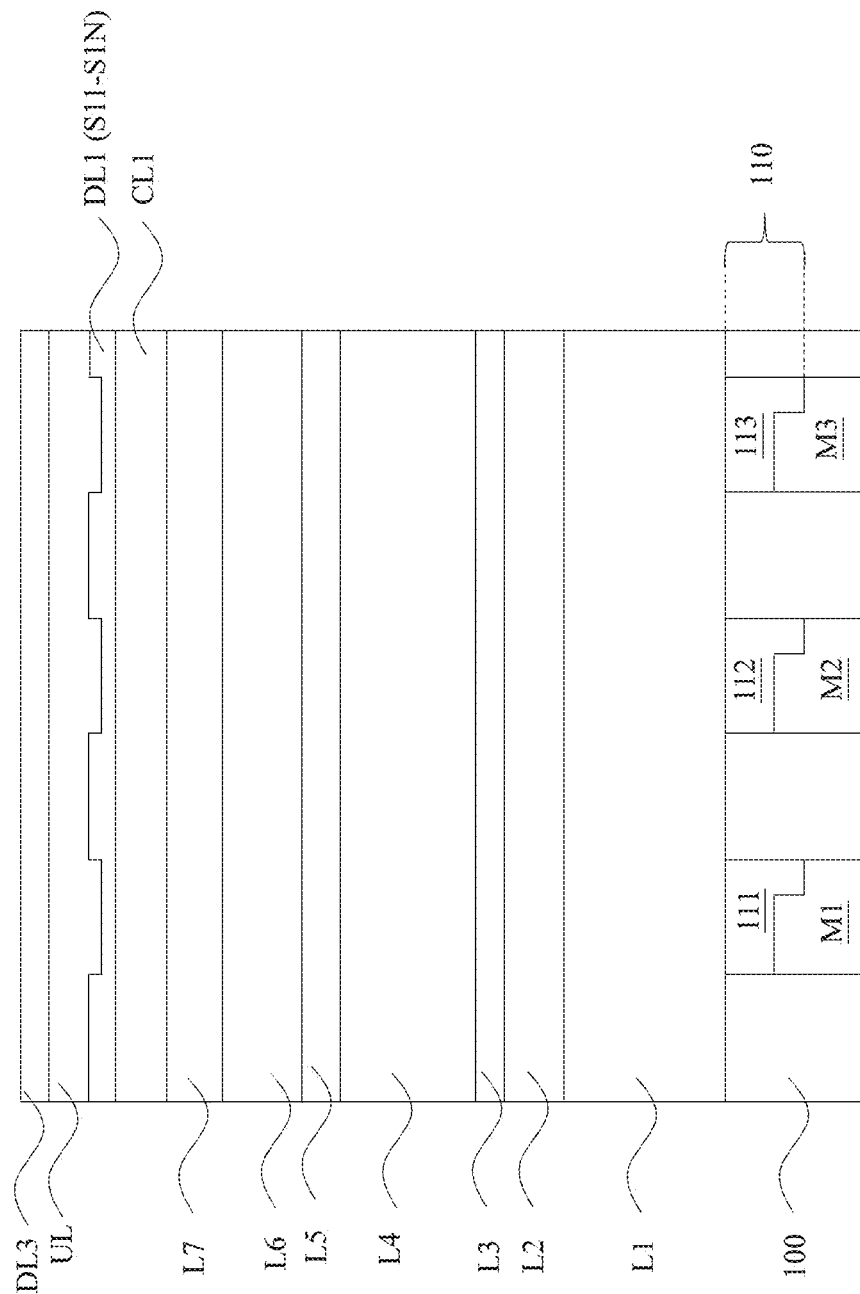
FIG. 23 is a schematic cross section view of the memory structure during the manufacturing process according to some embodiments of present disclosure.

In FIG. 23, a dielectric layer DL3 is deposited over the under layer UL.

Figure 24:
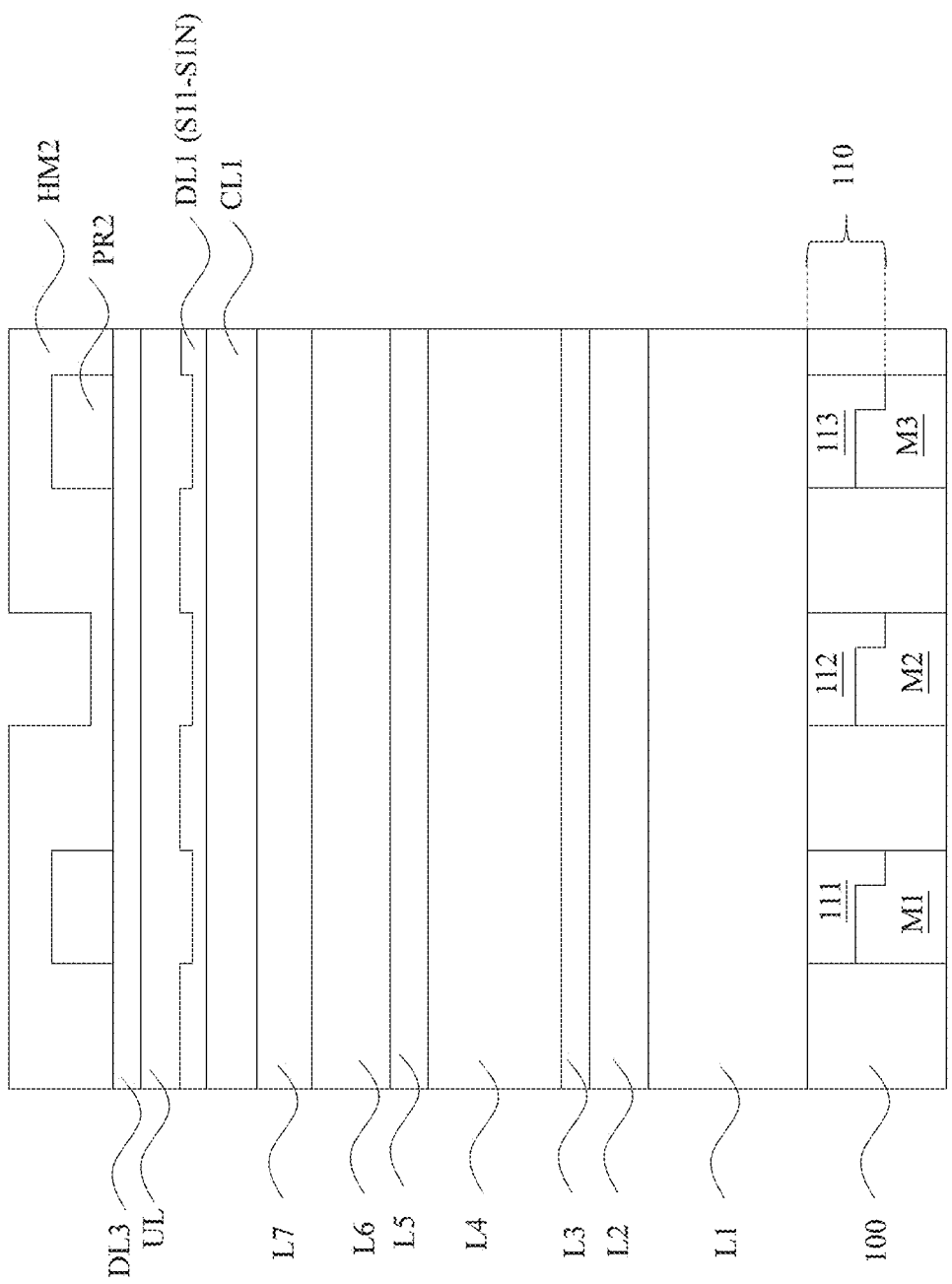
FIG. 24 is a schematic cross section view of the memory structure during the manufacturing process according to some embodiments of present disclosure.

In FIG. 24, a photoresistor layer PR2 is deposited over the dielectric layer DL3. The photoresistor layer PR2 is then patterned. A hard mask layer HM2 is deposited along a contour of the patterned photoresistor layer PR2. Therefore, the hard mask layer HM2 has a similar contour as the photoresistor layer PR2.

Figure 25:
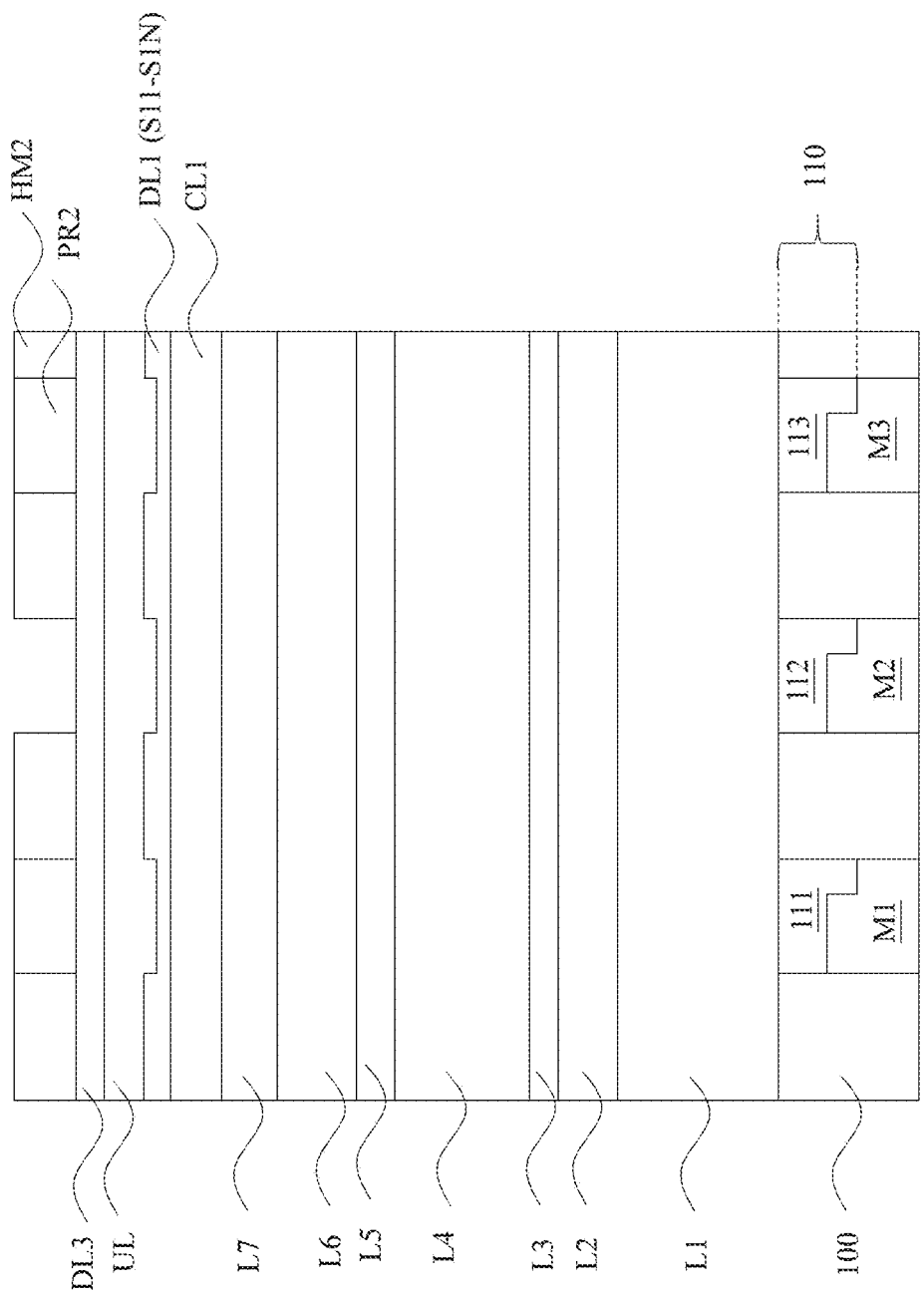
FIG. 25 is a schematic cross section view of the memory structure during the manufacturing process according to some embodiments of present disclosure.

In FIG. 25, the hard mask HM2 is etched. A top surface of the photoresistor PR2 and a portion of the dielectric layer DL3 are exposed. As illustrated in FIG. 25, the remaining portion of the hard mask layer HM2 becomes sidewalls of the remaining portion of the photoresistor layer PR2.

Figure 26:
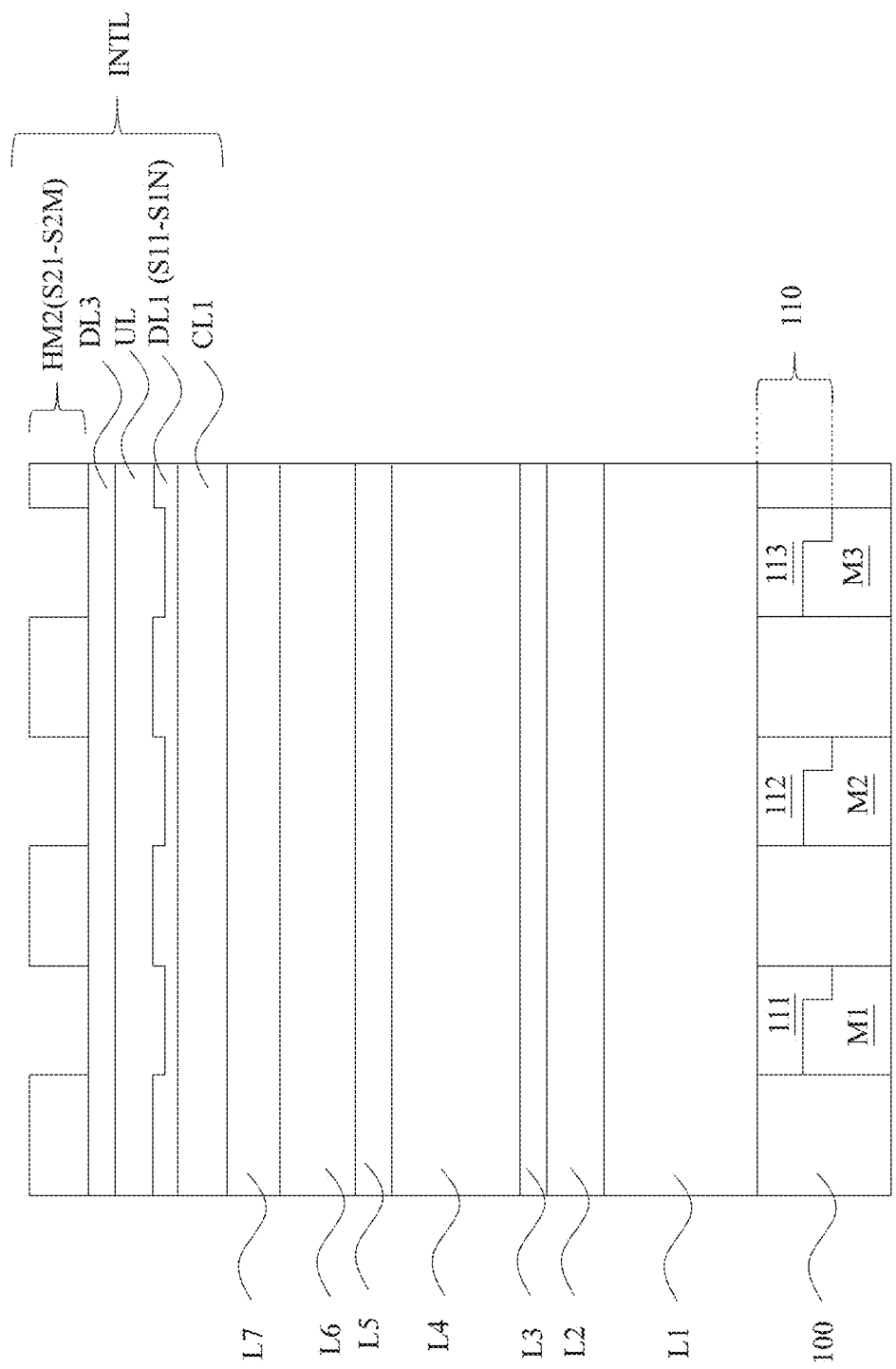
FIG. 26 is a schematic cross section view of the memory structure during the manufacturing process according to some embodiments of present disclosure.

In FIG. 26, the photoresistor layer PR2 is etched and the hard mask layer HM2 is remained.

The remaining hard mask layer HM2 shown in FIG. 26 is apart of the array patter AP shown in FIG. 2. More specifically, the remaining hard mask layer HM2 shown in FIG. 26 forms the plurality of second strips S21-S2M shown in FIG. 2.

In some embodiments, the manufacturing process shown in FIG. 22 to FIG. 26 is a pitch doubling process. Compared the pitch in the photoresistor layer PR2 shown in FIG. 24 to the pitch in the hard mask layer HM2 shown in FIG. 26, the pitch of the hard mask layer HM2 shown in FIG. 26 is about half of the pitch in the photoresistor layer PR2 shown in FIG. 24.

In some embodiments, the carbon layer CL1, the patterned dielectric layer DL1, the under layer UL, the dielectric layer DL3, and the patterned hard mask layer HM2 are an integrated layer INTL which will be etched in the subsequent process described below.

Figure 27:
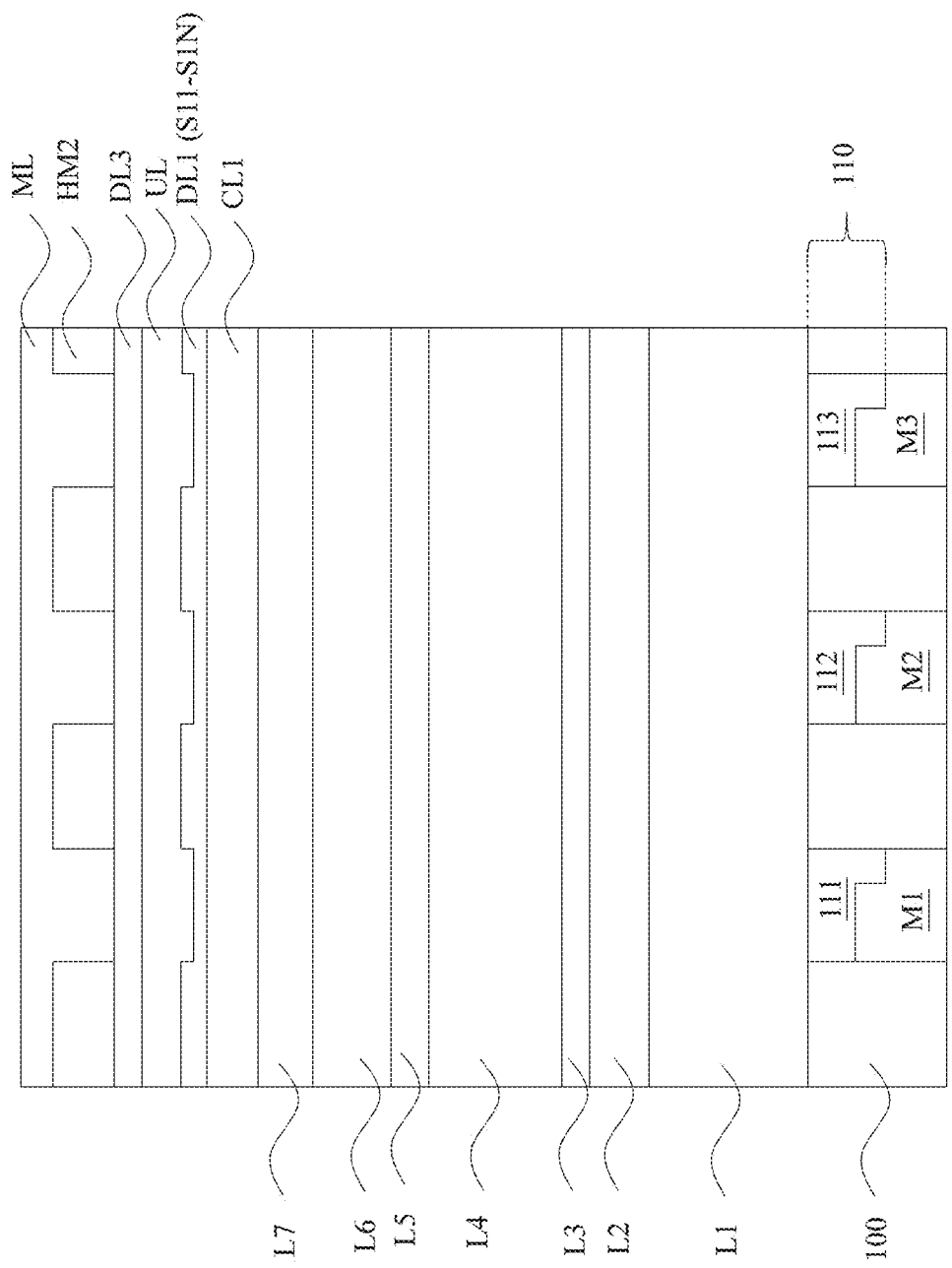
FIG. 27 is a schematic cross section view of the memory structure during the manufacturing process according to some embodiments of present disclosure.

In FIG. 27, the masking layer ML is deposited over the patterned hard mask layer HM2. A photolithography process is performed to pattern the masking layer ML by using the chop mask CM (shown in FIG. 3) so as to define the edge portion EP of the array pattern AP and the rectangle portion RP of the array pattern AP as illustrated in FIG. 2.

In some embodiments, after the photolithography process, a portion of the masking layer ML corresponds to the rectangle pattern CMrec of the chop mask CM is removed. Therefore, the array pattern AP disposed below the remaining masking layer ML (i.e., the edge portion EP of the array pattern AP) is still covered by the masking layer ML, and the rest of the array pattern AP (i.e., the rectangle portion RP of the array pattern AP) is exposed.

Figure 28:
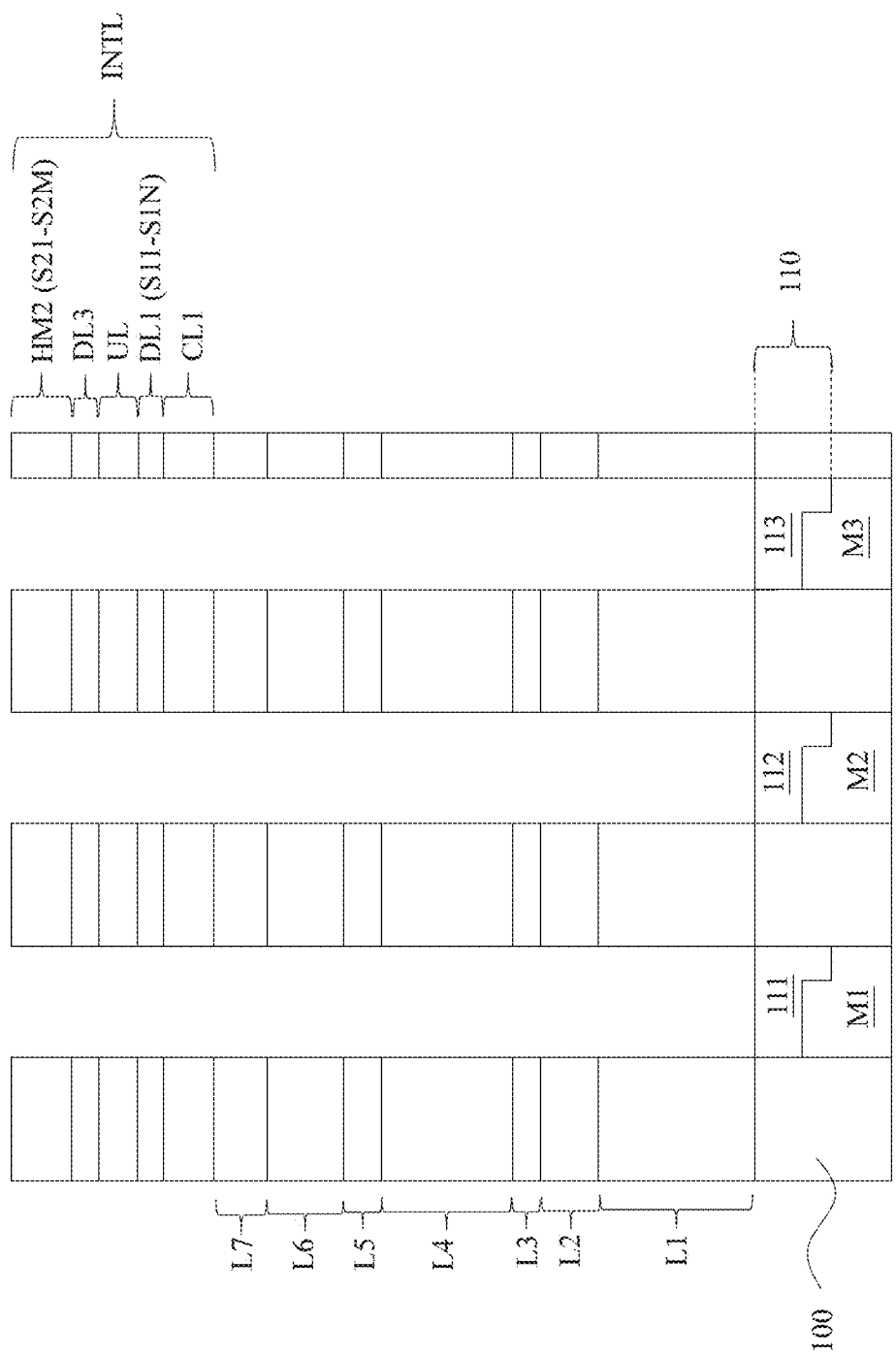
FIG. 28 is a schematic cross section view of the memory structure during the manufacturing process according to some embodiments of present disclosure.

FIG. 28 is illustrated the integrated layer INTL within the rectangle portion RP of the array pattern AP. No masking layer ML is remained in FIG. 28. It is noted that the masking layer ML is still remained above the edge portion EP of the array pattern AP, which is not illustrated in FIG. 28. In FIG. 28, the integrated layer INTL and the plurality of layers (including the oxide layer L1, the oxide L2, the nitride layer L3, the oxide layer L4, the nitride layer L5, the conductive layer L6, and the oxide layer L7) are etched according to the edge portion EP of the array pattern AP. As illustrated in FIG. 28, the integrated layer INTL and the plurality of layer L1-L7 are etched according to profile of the hard mask layer HM2 and the dielectric layer DL1. After the etching process, the landing pads 111-113 are exposed.

Figure 29:
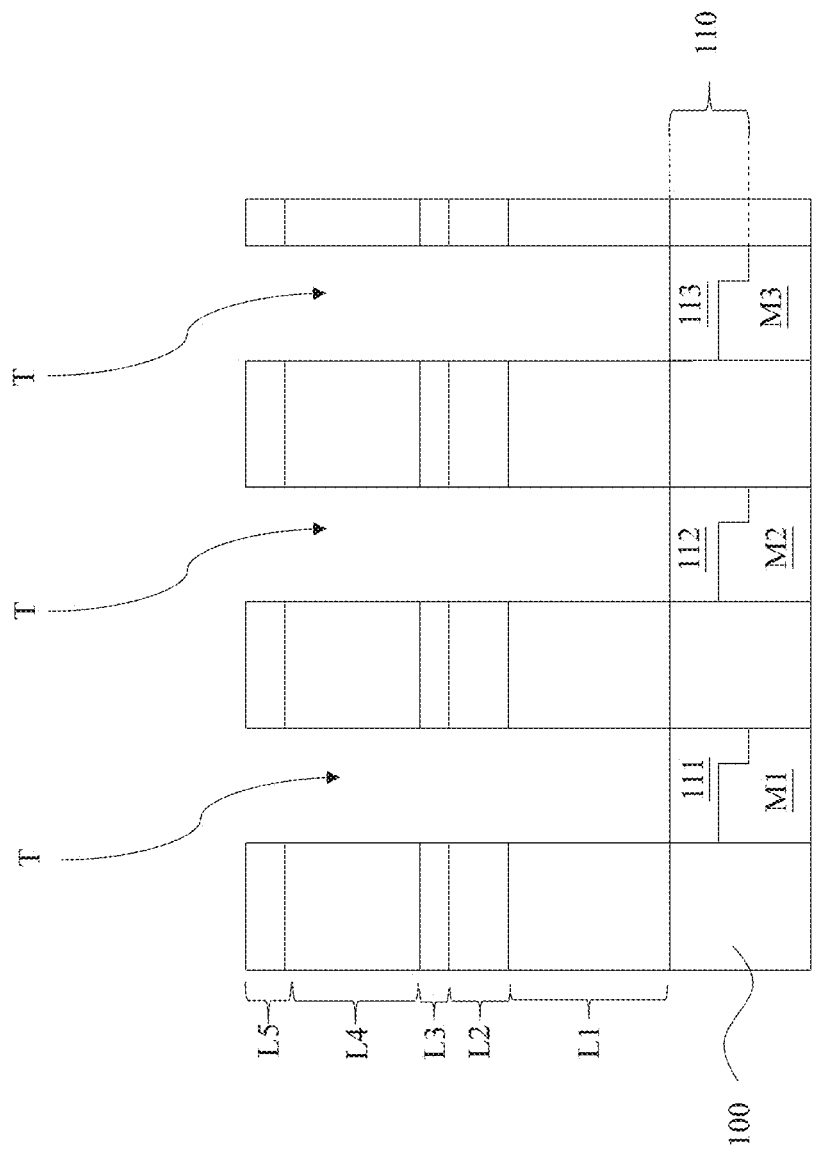
FIG. 29 is a schematic cross section view of the memory structure during the manufacturing process according to some embodiments of present disclosure.

In FIG. 29, the conductive layer L6 is removed, therefore, the layers (including the integrated layer INTL and the oxide layer L7) above the conductive layer L6 are removed as well. The nitride layer L5 is exposed. The empty space enclosed by the plurality of layers L1-L5 and the landing pads 111-113 are the trenches T as shown in FIG. 2.

Figure 30:
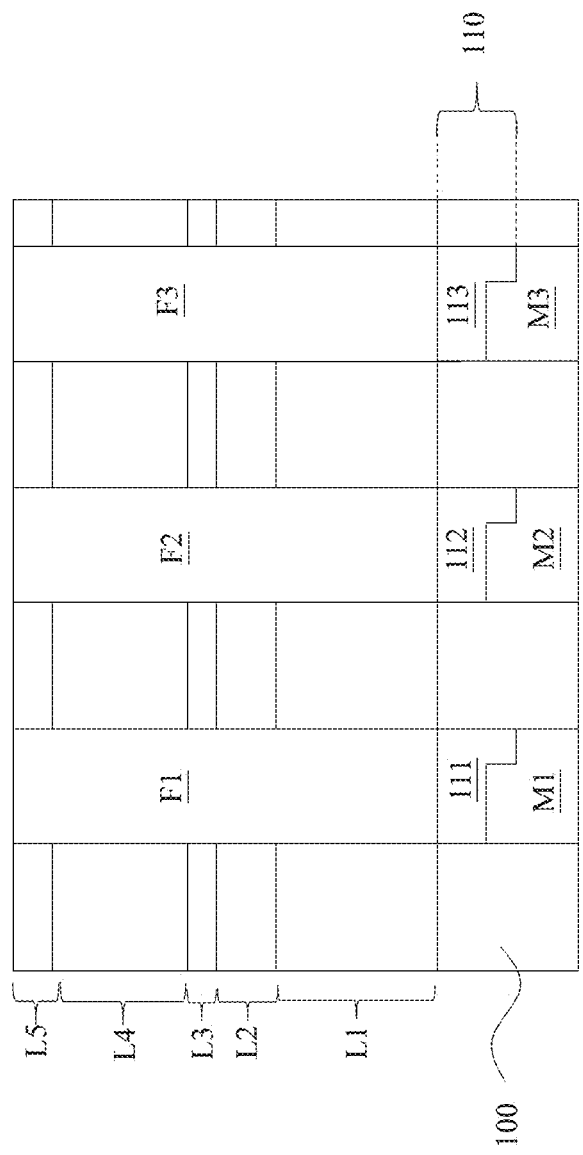
FIG. 30 is a schematic cross section view of the memory structure during the manufacturing process according to some embodiments of present disclosure.
Figure 31:
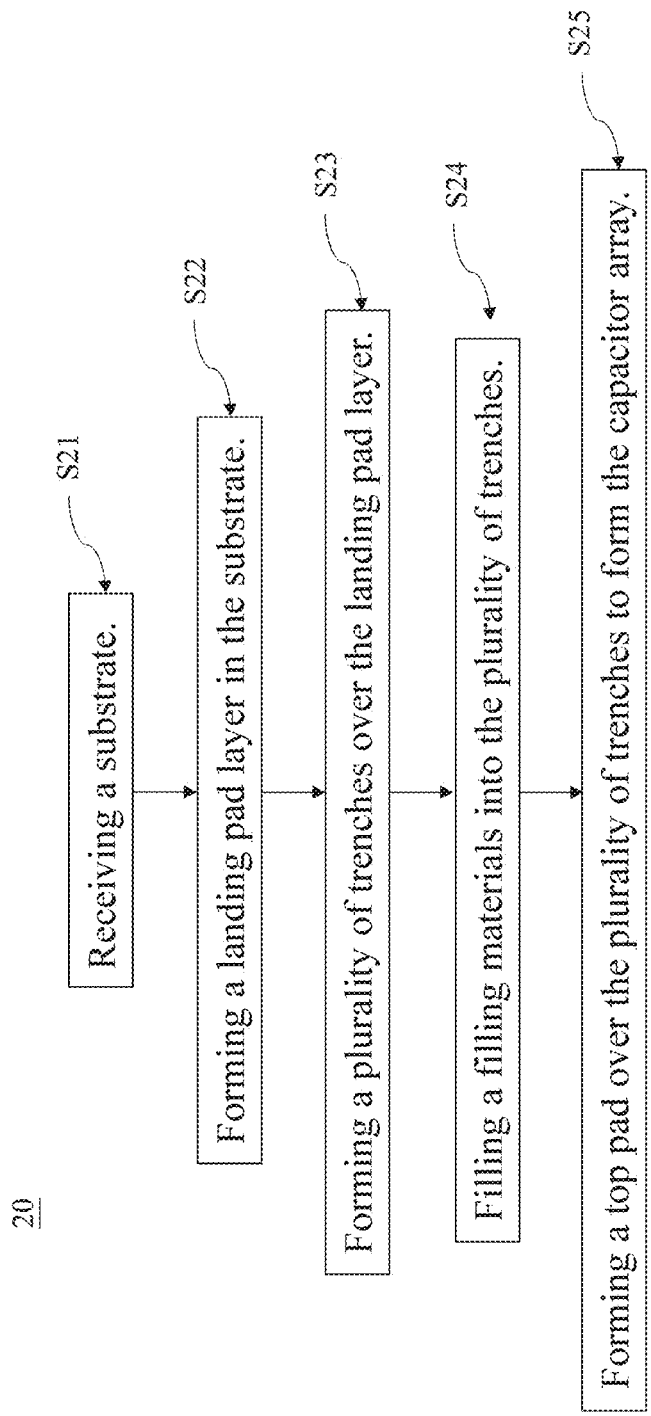
FIG. 31 is a flowchart diagram of a manufacturing method according to some embodiments of the present disclosure.

In FIG. 30, the trenches T are filled with the filling materials F1-F3. In some embodiments, a planarizing process (e.g., a chemical mechanical planarization) is performed after the filling materials F1-F3 are filled, for example.

After the filling materials F1-F3 are filled, the top pad 200 is deposited over the nitride layer L5 and in contact with the filling materials F1-F3 to form the capacitors C1-C3 as shown in FIG. 1.

Reference is made to FIG. 31 to FIG. 36. FIG. 31 to FIG. 36 are flowchart diagrams of a manufacturing method 20 according to some embodiments of the present disclosure. The manufacturing method 20 is performed to form the memory structure 10 with the capacitor array CA as illustrated in FIG. 1. The manufacturing method 20 includes operations S21, S22, S23, S24, and S25. To facilitating understanding, the manufacturing method 20 is described with the reference numerals as shown in FIG. 1 to FIG. 30.

In operation S21, the substrate 100 is received. The transistors M1-M3 are formed in the substrate 100.

In operation S22, the landing pad layer 110 including the landing pads 111-113 are formed in the substrate 100. The landing pads 111-113 are coupled to the gates of the transistors M1-M3, respectively.

In operation S23, the trenches T are formed over the landing pad layer 110.

In operation S24, the filling materials F1-F3 are filled into the trenches T. In some embodiments, the filling materials F1-F3 include dielectric materials.

In operation S25, the top pad 200 is formed over the trenches T to form the capacitors C1-C3. Therefore, the filled trenches T become the capacitor array CA.

Figure 32:
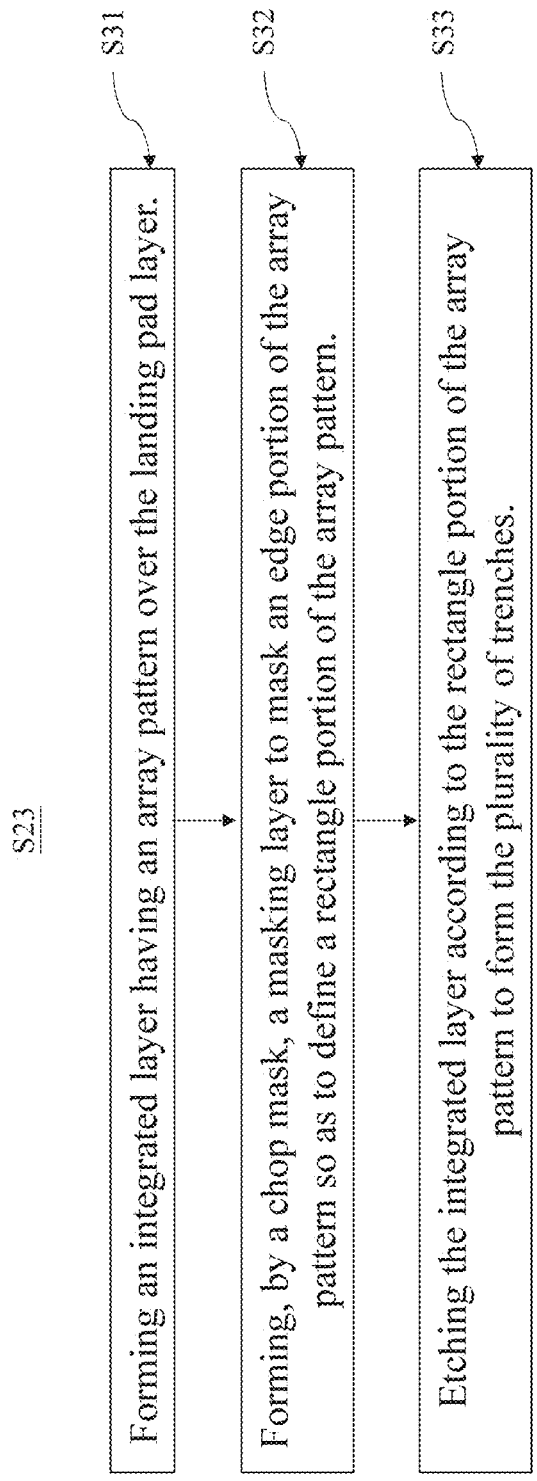
FIG. 32 is a flowchart diagram of a manufacturing method according to some embodiments of the present disclosure.

In some embodiments, the operation S23 includes the operations S31, S32, and S33 as illustrated in FIG. 32.

In operation S31, the integrated layer INTL is formed to have the array pattern AP over the landing pad layer 110.

In operation S32, the masking layer ML is formed over the integrated layer INTL, and patterned by the chop mask CM to mask the edge portion EP of the array pattern AP so as to define the rectangle portion RP of the array pattern AP. The edge portion EP of the array pattern AP surrounds the rectangle portion RP of the array pattern AP.

In operation S33, the integrated layer INTL is etched according to the rectangle portion RP of the array pattern AP to form the trenches T.

Figure 33:
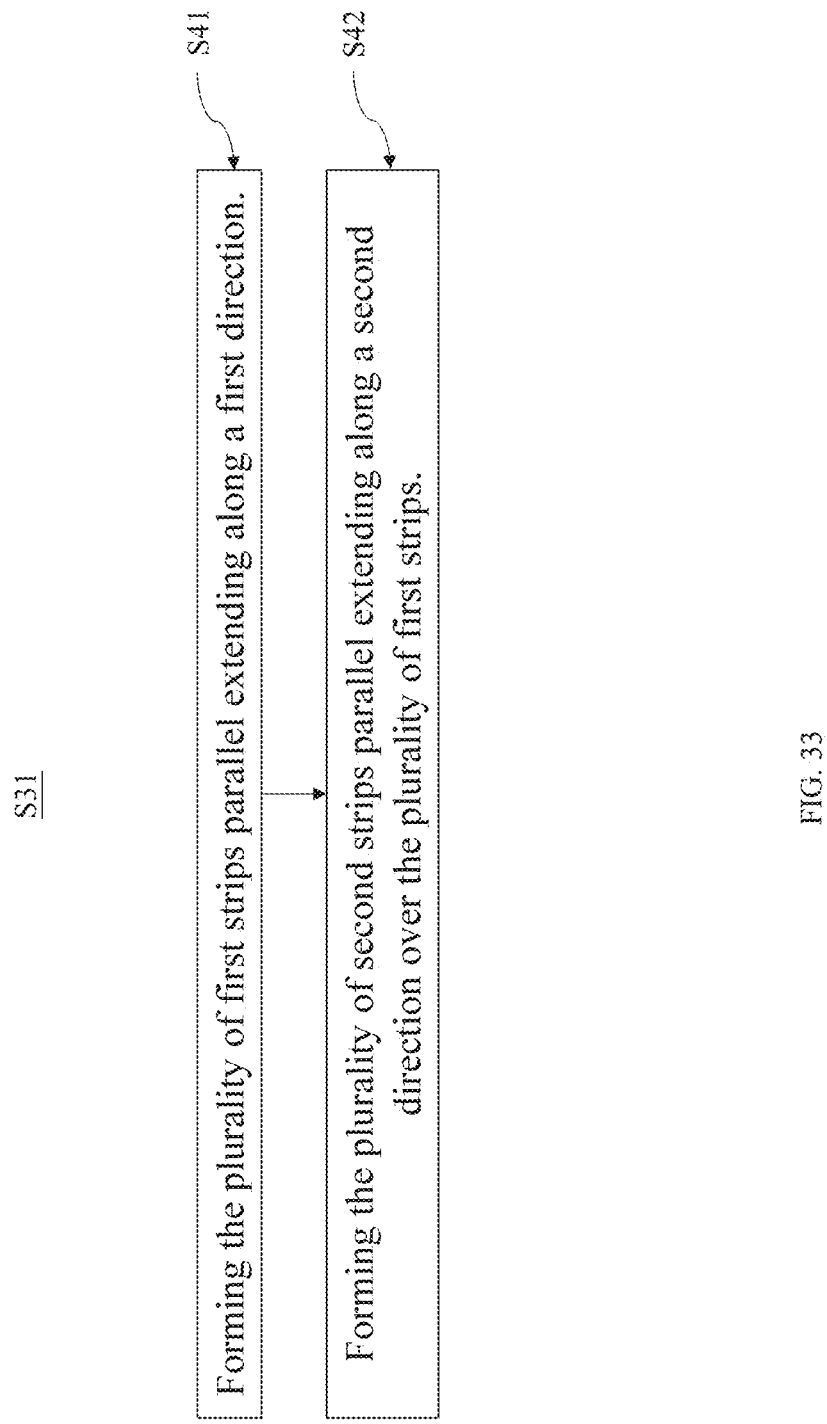
FIG. 33 is a flowchart diagram of a manufacturing method according to some embodiments of the present disclosure.

In some embodiments, the operation S31 includes the operations S41 and S42 as shown in FIG. 33.

In operation S41, the first strips S11-S1N are formed and parallel extending along the first direction.

In operation S42, the second strips S21-S2M are formed and parallel extending along the second direction. The first direction is different for the second direction. After the operation S42 is performed, the gaps G are formed and arranged between the first strips S11-S1N and the second strips S21-S2M form the top view of the substrate 200 as shown in FIG. 2.

Figure 34:
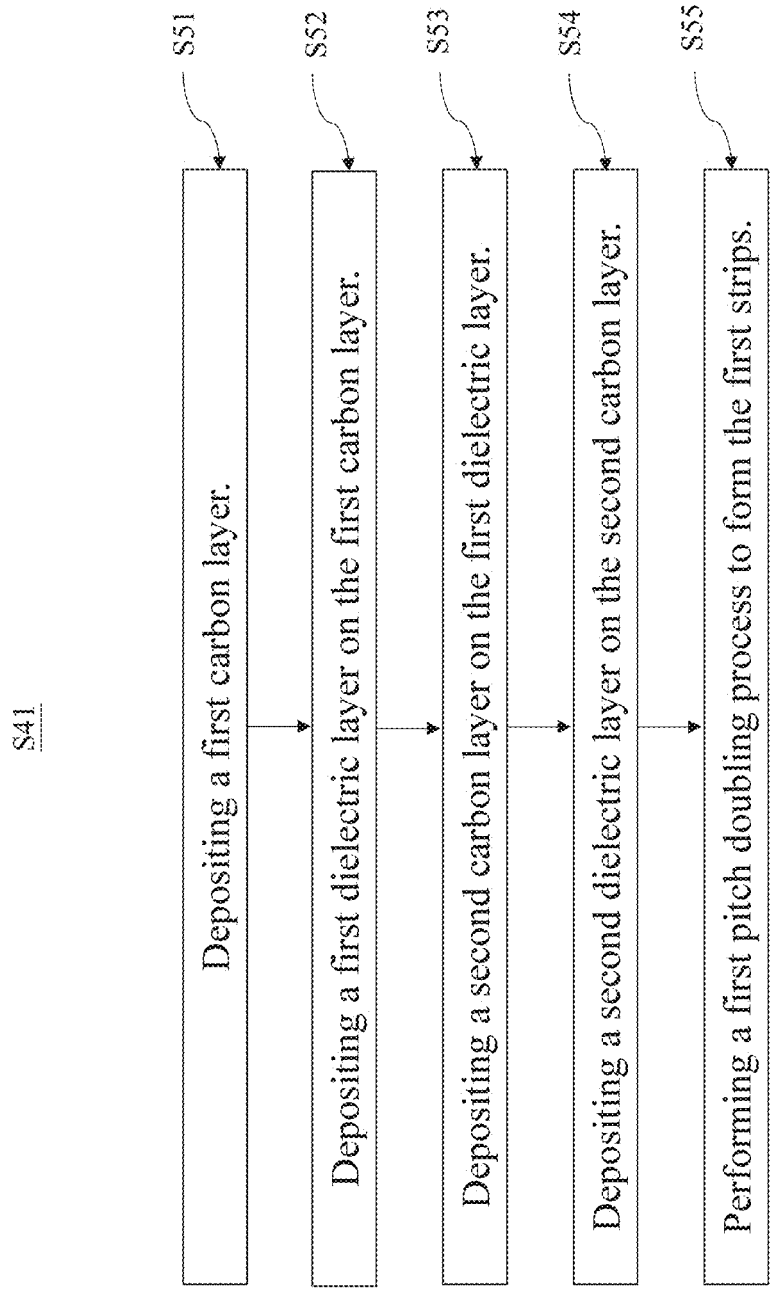
FIG. 34 is a flowchart diagram of a manufacturing method according to some embodiments of the present disclosure.

In some embodiments, the operation S41 includes the operations S51, S52, S53, S54, and S55 as shown in FIG. 34.

In operation S51, the carbon layer CL1 is deposited. More specifically, the carbon layer CL1 is deposited on the oxide layer L7.

In operation S52, the dielectric layer DL1 is deposited on the carbon layer CL1.

In operation S53, the carbon layer CL2 is deposited on the dielectric layer DL1.

In operation S54, the dielectric layer DL2 is deposited on the carbon layer CL2.

In operation S55, the pitch doubling process is performed to form the first strips S11-S1N. During the operation S55, the photoresistor layer PR1 is deposited and patterned on the dielectric layer DL2. The hard mask layer HM1 is deposited along the contour of the patterned photoresistor layer PR1. The hard mask HM1 is etched to expose the photoresistor layer PR1 and the dielectric layer DL2. The dielectric layer DL2, the carbon layer CL2, and the dielectric layer DL1 are then etched to form the first strips S11-S1N. The first strips S1t-S1N are formed in the dielectric layer DL1. After the operation S55, the dielectric layer DL1 is exposed.

Figure 35:
FIG. 35 is a flowchart diagram of a manufacturing method according to some embodiments of the present disclosure.

In some embodiments, the operation S42 includes the operations S61, S62, S63, and S64 as shown in FIG. 35.

In operation S61, the under layer UL is spin coated over the first strips S11-S1N. In some embodiments, the under layer UL is a photoresistor layer.

In operations S62, the dielectric layer DL3 is deposited over the under layer UL.

In operation S63, the pitch doubling process is performed to form the second strips S21-S2M. During the operation S63, the photoresistor layer PR2 is deposited and patterned on the dielectric layer DL3. The hard mask layer HM2 is deposited along the contour of the patterned photoresistor layer PR2. The hard mask HM2 is etched to expose the photoresistor layer PR2 and the dielectric layer DL3. The photoresistor layer PR2 is then removed to form the second strips S21-S2M. The second strips S21-S2M is formed in the hard mask layer HM2. After the operation S63, the dielectric layer DL3 is exposed.

Figure 36:
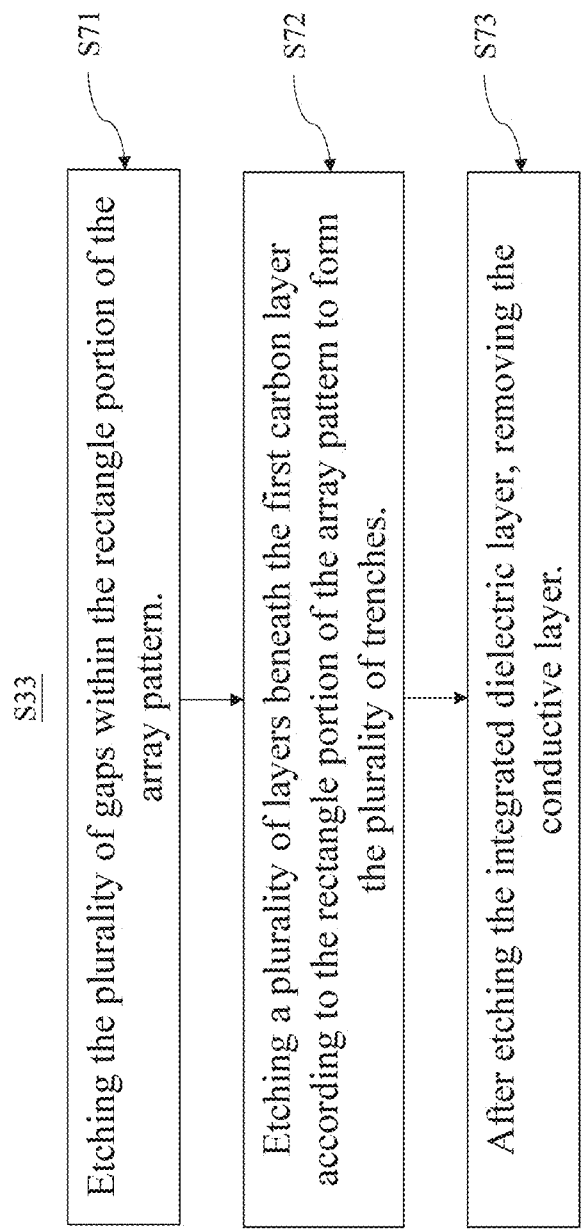
FIG. 36 is a flowchart diagram of a manufacturing method according to some embodiments of the present disclosure.

In some embodiments, the operation S33 includes the operations S71, S72, and S73 as shown in FIG. 36.

In operation S71, the gaps G within the rectangle portion RP of the array pattern AP are etched according to the rectangle portion RP of the array pattern AP. In contrast, the gaps within the edge portion EP of the array pattern AP are not etched.

In operation S72, the plurality of layers L1-L7 are etched according to the rectangle portion RP of the array pattern AP to form the trenches T.

In operation S73, after the plurality of layers L1-L7, the conductive layer L6 is removed. After the conductive layer L6 is removed, the layers above the conductive layer L6 are automatically removed as well.

One aspect of the present disclosure provides a manufacturing method of a memory structure. The manufacturing method includes the operations of: receiving a substrate; forming a landing pad layer in the substrate; forming a plurality of trenches over the landing pad layer; and forming a top pad over the plurality of trenches to form the capacitor array. The operation of forming the plurality of trenches over the landing pad layer includes the operations of: forming an integrated layer having an array pattern over the landing pad layer; forming, by a chop mask, a masking layer to mask an edge portion of the array pattern so as to define a rectangle portion of the array pattern; and etching the integrated layer according to the rectangle portion of the array pattern to form the plurality of trenches. The edge portion of the array pattern surrounds the rectangle portion of the array pattern.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A manufacturing method of a memory structure, comprising:
   receiving a substrate;
   forming a landing pad layer in the substrate;
   forming a plurality of trenches over the landing pad layer, comprising:
      forming an integrated layer having an array pattern over the landing pad layer;
      forming, by a chop mask, a masking layer to mask an edge portion of the array pattern so as to define a rectangle portion of the array pattern, wherein the edge portion of the array pattern surrounds the rectangle portion of the array pattern; and
      etching the integrated layer according to the rectangle portion of the array pattern to form the plurality of trenches; and
   forming a top pad over the plurality of trenches to form a capacitor array.

2. The manufacturing method of claim 1, wherein the array pattern includes a plurality of first strips and a plurality of second strips, and forming the integrated layer having the array pattern over the landing pad layer comprises:
   forming the plurality of first strips parallel extending along a first direction; and
   forming the plurality of second strips parallel extending along a second direction over the plurality of first strips, wherein the second direction is different from the first direction,
   wherein a plurality of gaps are arranged between the plurality of first strips and the plurality of second strips from a top view of the substrate.

3. The manufacturing method of claim 2, wherein forming the plurality of first strips parallel extending along the first direction comprises:
   depositing a first carbon layer;
   depositing a first dielectric layer on the first carbon layer;
   depositing a second carbon layer on the first dielectric layer;
   depositing a second dielectric layer on the second carbon layer; and
   performing a first pitch doubling process to form the plurality of first strips.

4. The manufacturing method of claim 3, wherein forming the plurality of second strips parallel extending along the second direction over the plurality of first strips comprises:
   spin coating a first photoresistor layer over the plurality of first strips;
   depositing a third dielectric layer over the first photoresistor layer; and
   performing a second pitch doubling process to form the second strips.

5. The manufacturing method of claim 4, wherein the plurality of first strips are formed in the first dielectric layer, and the plurality of second strips are formed in the hard mask layer.

6. The manufacturing method of claim 4, wherein etching the integrated layer according to the rectangle portion of the array pattern to form the plurality of trenches comprises:
   etching the plurality of gaps within the rectangle portion of the array pattern.

7. The manufacturing method of claim 6, wherein etching the integrated layer according to the rectangle portion of the array pattern to form the plurality of trenches further comprises:
   etching a plurality of layers beneath the first carbon layer according to the rectangle portion of the array pattern to form the plurality of trenches.

8. The manufacturing method of claim 7, wherein the plurality of layers includes:
   a first oxide layer over the landing pad layer;
   a second oxide layer over the first oxide layer;
   a first nitride layer over the second oxide layer;
   a third oxide layer over the first nitride layer;
   a second nitride layer over the third oxide layer;
   a conductive layer over the second nitride layer; and
   a fourth oxide layer over the conductive layer and beneath the first carbon layer.

9. The manufacturing method of claim 8, wherein etching the plurality of layers according to the rectangle portion of the array pattern to form the plurality of trenches further comprises:

after etching the integrated dielectric layer, removing the conductive layer.

10. The manufacturing method of claim 2, wherein each of the plurality of gaps has a diamond shape from the top view of the substrate.

11. The manufacturing method of claim 10, wherein each of the plurality of gaps has a first diagonal about 30 nm.

12. The manufacturing method of claim 11, wherein each of the plurality of gaps has a second diagonal about 50 nm.

13. The manufacturing method of claim 2, wherein each of the plurality of trenches has a round shape from the top view of the substrate.

14. The manufacturing method of claim 2, wherein the plurality of gaps in an edge of the rectangle portion of the array pattern are aligned along a line from the top view of the substrate.

15. The manufacturing method of claim 1, further comprising:

filling a filling material into the plurality of trenches.

16. The manufacturing method of claim 1, wherein the chop mask has a rectangle pattern corresponding to the rectangle portion of the array pattern, wherein the rectangle pattern has a rectangle contour.

17. The manufacturing method of claim 1, wherein a first overlay margin between a first boundary of the rectangle portion of the array pattern and a nearest gap of the plurality of gaps within the rectangle portion of the array pattern is less than 15 nm.

18. The manufacturing method of claim 17, wherein a second overlay margin between a second boundary of the rectangle portion of the array pattern and a nearest gap of the plurality of gaps within the rectangle portion of the array pattern is less than 15 nm.

19. The manufacturing method of claim 18, wherein the first boundary is perpendicular to the second boundary.

20. The manufacturing method of claim 18, wherein the first overlay margin is less than 10 nm, and the second overlay margin is less than 13 nm.

* * * * *